US 7,910,025 B2

(12) United States Patent
Suzuki et al.

(10) Patent No.: US 7,910,025 B2
(45) Date of Patent: Mar. 22, 2011

(54) SOLUTION COMPOSITION AND POLYMER LIGHT-EMITTING DEVICE

(75) Inventors: Tomoyuki Suzuki, Nishitokyo (JP); Kiyotoshi Iimura, Tsukuba (JP); Katsumi Agata, Ichikawa (JP)

(73) Assignee: Sumitomo Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/575,755

(22) PCT Filed: Oct. 13, 2005

(86) PCT No.: PCT/JP2005/019257
§ 371 (c)(1),
(2), (4) Date: Aug. 22, 2007

(87) PCT Pub. No.: WO2006/041207
PCT Pub. Date: Apr. 20, 2006

(65) Prior Publication Data
US 2008/0061673 A1 Mar. 13, 2008

(30) Foreign Application Priority Data
Oct. 15, 2004 (JP) ................. 2004-301417

(51) Int. Cl.
*H01B 1/00* (2006.01)
*H01J 1/62* (2006.01)
*H01L 35/24* (2006.01)

(52) U.S. Cl. ............. 252/500; 313/504; 257/40
(58) Field of Classification Search ......... 252/500; 313/504; 257/40
See application file for complete search history.

(56) References Cited

U.S. PATENT DOCUMENTS

| 5,589,108 | A  | * | 12/1996 | Shimizu et al. ........... 252/500 |
| 6,627,377 | B1 | * | 9/2003  | Itatani et al. ........... 430/270.1 |
| 2004/0131881 | A1 | * | 7/2004 | Zheng et al. ........... 428/690 |
| 2007/0020479 | A1 | * | 1/2007 | Uetani et al. ........... 428/690 |
| 2008/0274303 | A1 | * | 11/2008 | Agata et al. ........... 428/1.1 |

FOREIGN PATENT DOCUMENTS

| CN | 1463278 A | 12/2003 |
| JP | 2000-323276 | 11/2000 |
| JP | 2004-520477 | 7/2004 |
| WO | 00/59267 | 10/2000 |
| WO | WO 02/096970 A1 | 12/2002 |
| WO | WO 2004099340 A1 * | 11/2004 |
| WO | WO 2005082969 * | 9/2005 |

* cited by examiner

*Primary Examiner* — Mark Kopec
*Assistant Examiner* — Jaison P Thomas
(74) *Attorney, Agent, or Firm* — Sughrue Mion, PLLC

(57) ABSTRACT

To provide a solution composition having a significantly high viscosity comprising one or more solvent(s) and one or more polymer(s) having a polystyrene-reduced Z-average molecular weight of $1.0 \times 10^5$ to $5.0 \times 10^6$, and the solution composition allows to easily obtain a film having a favorable film formability and high uniformity.

13 Claims, No Drawings

SOLUTION COMPOSITION AND POLYMER LIGHT-EMITTING DEVICE

TECHNICAL FIELD

The present invention relates to a solution composition and polymer light-emitting device (hereinafter, occasionally referred to polymer LED) using the same.

BACKGROUND ART

Various light-emitting devices using a polymer as a light-emitting material (polymer LEDs) have been studied.

As a method for forming a light-emitting layer of a polymer LED, a forming method by an inkjet method using a solution composition containing a polymer and a solvent has an advantage of enabling production of a light-emitting device of large area at low cost.

As solution compositions applicable to such inkjet method, for example, a solution composition containing a polyfluorene derivative and a solvent (WO00/59267 pamphlet) and a solution composition containing polyarylenevinylenes and a solvent (WO02/96970 pamphlet, Kokai (Japan unexamined patent publication) No. 2000-323276) are known.

However, when forming a light-emitting layer with by an inkjet method using a solution composition, if the viscosity of the solution composition is too low, this causes a problem that a film having high uniformity is hardly obtainable. Therefore, a solution composition having high viscosity is desired.

Furthermore, according to restrictions other than the viscosity, the solution composition is required for keeping the polymer concentration thereof within a specific range and having high viscosity; to meet this requirement, the conventional solution compositions are responding by selecting the kind of the solvent depending on the kind of the polymer.

DISCLOSURE OF THE INVENTION

After having diligently studied to solve the problems mentioned above, the present inventors have found that a solution composition employing a polymer having Z-average molecular weight in a specific range is highly viscous, thus have achieved the present invention.

Namely, the invention provides a solution composition comprising one or more solvent(s) and one or more polymer(s) having a polystyrene-reduced Z-average molecular weight of $1.0 \times 10^5$ to $5.0 \times 10^6$.

BEST MODE FOR CARRYING OUT THE INVENTION

The polymer used for the solution composition of the invention has a polystyrene-reduced Z-average molecular weight of $1.0 \times 10^5$ to $5.0 \times 10^6$, preferably $3.0 \times 10^5$ to $3.0 \times 10^6$, and more preferably $5.0 \times 10^5$ to $1.5 \times 10^6$. If the Z-average molecular weight of the polymer is too low, the viscosity thereof decreases and problems such as deteriorating the properties of a device tends to be caused when the polymer is applied to a polymer LED; if the Z-average molecular weight thereof is too high, problems such as decrease of solubility in a solvent tends to be caused.

A number-average molecular weight is preferably $5.0 \times 10^4$ to $3.0 \times 10^5$, more preferably $7.0 \times 10^4$ to $2.5 \times 10^5$, and even more preferably $1.0 \times 10^5$ to $2.0 \times 10^5$.

A weight-average molecular weight is preferably $1.0 \times 10^5$ to $1.0 \times 10^6$, more preferably $2.0 \times 10^5$ to $7.0 \times 10^5$, and even more preferably $3.0 \times 10^5$ to $5.0 \times 10^5$.

Since the number-average molecular weight, weight-average molecular weight, and Z-average molecular weight are preferably in specific ranges respectively, more preferable is a polymer having a polystyrene-reduced number-average molecular weight of $5.0 \times 10^4$ to $3.0 \times 10^5$, polystyrene-reduced weight-average molecular weight of $1.0 \times 10^5$ to $1.0 \times 10^6$, and polystyrene-reduced Z-average molecular weight of $3.0 \times 10^5$ to $3.0 \times 10^6$.

The definitions of the Z-average molecular weight, number-average molecular weight, and weight-average molecular weight are disclosed in many books, for example, being disclosed in (KAGAKU-DAIJITEN compact edition Vol. 8, page 224 (published by KYORITSU SHUPPAN CO., LTD.)).

The solution composition of the invention preferably has a viscosity of 5 mPa·s or more and 20 mPa·s or less.

The polymer used for the solution composition of the invention is not particularly limited as long as having the polystyrene-reduced Z-average molecular weight of $1.0 \times 10^5$ to $5.0 \times 10^6$; and a solution composition is strongly desired for producing polymer LEDs, organic semiconductors, and organic solar cells, and production thereof with using the solution composition is advantageous to save industrial costs. Accordingly, polymers emitting fluorescence in the solid state, polymers emitting phosphorescence in the solid state, hole transporting polymers, electron transporting polymers, and conductive polymers are exemplified as the preferred examples, and polymers emitting fluorescence in the solid state are exemplified as more preferred examples.

The polymer emitting fluorescence in the solid state includes a conjugated aromatic polymer which may be a homopolymer or a copolymer. In view of the properties of polymer LEDs, in a main chain of the polymer, a carbon atom residing on an aromatic ring and other carbon atom residing on other aromatic ring of the adjacent repeating unit are preferably bonded each other directly or through an oxygen atom, nitrogen atom, sulfur atom, or phosphor atom.

The conjugated aromatic polymer includes polymers having, as a repeating unit, the following respective formulas (1-1), (1-2), (2), (2-2), (3), (4), (5-1), (5-2), (5-3), (5-4), arylene group, fluorenediyl group, divalent aromatic amine group, or divalent heterocyclic group.

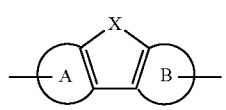

Formula (1-1)

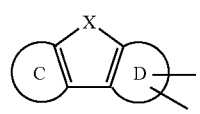

Formula (1-2)

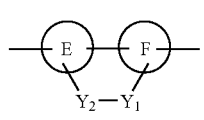

Formula (2)

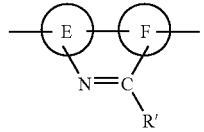

Formula (2-2)

-continued

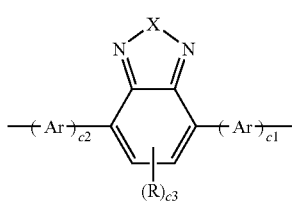
Formula (3)

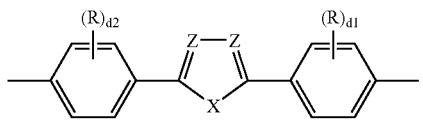
Formula (4)

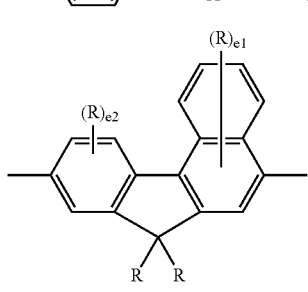
Formula (5-1)

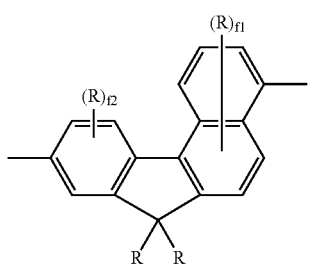
Formula (5-2)

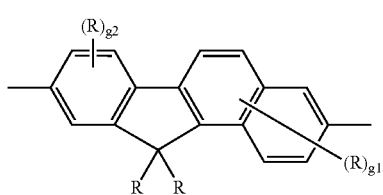
Formula (5-3)

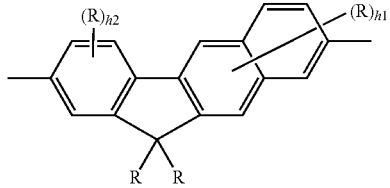
Formula (5-4)

In the formulas, A ring, B ring, C ring, D ring, E ring, and F ring each independently represent an aromatic ring. R represents an alkyl group, alkoxy group, alkylthio group, alkylsilyl group, alkyl amino group, hydroxyl group, amino group, carboxyl group, aldehyde group, cyano group, aryl group, aryloxy group, arylthio group, or arylalkyl group. X represents —O—, —N(R)—, —Si(R)$_2$—, —Se—, —B(R)—, —S—, —S(=O)—, —SO$_2$—, —P(=O)(R)— or —P(R)—. $Y_1$ and $Y_2$ each independently represent —O—, —S—, —C(R')$_2$—, —C(=O)—, —S(=O)—, —SO$_2$—, —Si (R')$_2$—, —N(R')—, —B(R')—, —P(R')—, or —P(=O) (R')—. R' represents a hydrogen atom, alkyl group, alkoxy group, alkylthio group, alkylsilyl group, alkylamino group, hydroxyl group, amino group, carboxyl group, aldehyde group, cyano group, aryl group, aryloxy group, arylthio group, and arylalkyl group. Wherein $Y_1$ and $Y_2$ never become same each other. Z represents —C(R')— or —N—. Ar represents arylene group or divalent heterocyclic group. When a plurality of Rs, R's, Xs, Zs, and Ars are contained in one structure, they may be the same or different each other. c1 and c2 each independently represent an integer of 0 or 1, and c3 each independently represents an integer of 0 to 2. d1 and d2 each independently represent an integer of 0 to 4. e1 represents an integer of 0 to 5, and e2 represents an integer of 0 to 3. f1 represents an integer of 0 to 5, and f2 represents an integer of 0 to 3. g1 represents an integer of 0 to 5, and g2 represents an integer of 0 to 3. h1 represents an integer of 0 to 5, and h2 represents an integer of 0 to 3.

The repeating units mentioned above, in view of easiness of synthesis, solubility in a solvent, and the like, preferable are the above formulas (1-1), (2), (3), (4), (5-1), (5-2), (5-3), (5-4), and divalent aromatic amine group, arylene group, and fluorenediyl group; and more preferable are fluorenediyl group, divalent aromatic amine group, the above formulas (1-1), (5-1), (5-3), and (5-4).

The alkyl group may be a linear, branched, or cyclic chain, usually has a carbon number of about 1 to 20, and examples thereof include methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, and lauryl group.

The alkoxy group may be a linear, branched, or cyclic chain, usually has a carbon number of about 1 to 20, and examples thereof include a methoxy group, ethoxy group, propyloxy group, i-propyloxy group, butoxy group, i-butoxy group, t-butoxy group, pentyloxy group, iso-amyloxy group, hexyloxy group, cyclohexyloxy group, heptyloxy group, octyloxy group, 2-ethylhexyloxy group, nonyloxy group, decyloxy group, 3,7-dimethyloctyloxy group, and lauryloxy group.

The alkylthio may be a linear, branched, or cyclic chain, usually has a carbon number of about 1 to 20, and examples thereof include a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, and laurylthio group.

The alkylsilyl group may be a linear, branched, or cyclic chain, usually has a carbon number of about 1 to 60, and examples thereof include a methylsilyl group, ethylsilyl group, propylsilyl group, i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, and lauryldimethylsilyl group.

The alkylamino group may be a linear, branched, or cyclic chain, and may be monoalkylamino group or dialkylamino group, usually has a carbon number of about 1 to 40, and examples thereof include a methylamino group, dimethylamino group, ethylamino group, diethylamino group, propylamino group, i-propylamino group, butylamino group, i-butylamino group, t-butylamino group, pentylamino group, hexylamino group, cyclohexyl amino group, heptylamino group, octylamino group, 2-ethylhexylamino group, nonylamino group, decylamino group, 3,7-dimethyloctylamino group, and laurylamino group.

The aryl group typically has a carbon number of about 6 to 60, and examples thereof include a phenyl group, naphthyl group, and anthracenyl group.

The phenyl group of the aryl group includes a monovalent residue in which any one of R's of a substituted or unsubstituted benzene of the following structure is removed. As R' in the following structure is exemplified with the concrete examples of the above R' are exemplified.

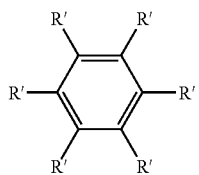

The naphthyl group includes a monovalent residue in which any one of R's of a substituted or unsubstituted naphthalene of the following structure is removed. As R' in the following structure, the concrete examples of the above R' are exemplified.

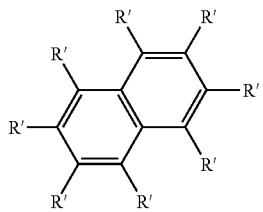

The anthracenyl group includes a monovalent residue in which any one of R's of a substituted or unsubstituted anthracene of the following structure is removed. As R' in the following structure, the concrete examples of the above R' are exemplified.

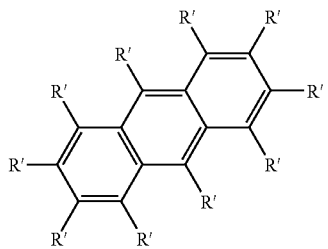

The aryloxy group usually has a carbon number of about 6 to 60, and preferably 7 to 48; concrete examples thereof include phenoxy group, $C_1$-$C_{12}$ alkoxyphenoxy group, $C_1$-$C_{12}$ alkylphenoxy group, 1-naphthyloxy group, 2-naphthyloxy group, and pentafluorophenyloxy group, and preferably $C_1$-$C_{12}$ alkoxyphenoxy group and $C_1$-$C_{12}$ alkylphenoxy group.

Concrete examples of $C_1$-$C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, and lauryloxy.

Concrete examples of $C_1$-$C_{12}$ alkylphenoxy group include methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, iso-amylphenoxy group, hexylphenoxy group, heptylphenoxy group, octylphenoxy group, nonylphenoxy group, decylphenoxy group, and dodecylphenoxy group.

The arylthio group usually has a carbon number of about 6 to 60, and preferably 7 to 48; concrete examples thereof include phenylthio group, $C_1$-$C_{12}$ alkoxyphenylthio group, $C_1$-$C_{12}$ alkylphenylthio group, 1-naphthylthio group, 2-naphthylthio group, and pentafluorophenylthio group, and preferably $C_1$-$C_{12}$ alkoxyphenylthio group and $C_1$-$C_{12}$ alkylphenylthio group.

The arylalkyl group usually has a carbon number of about 7 to 60, and preferably 7 to 48; concrete examples thereof include phenyl-$C_1$-$C_{12}$ alkyl group, $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphthyl-$C_1$-$C_{12}$ alkyl group, and 2-naphthyl-$C_1$-$C_{12}$ alkyl group, and preferably $C_1$-$C_{12}$ alkoxyphenyl-$C_1$-$C_{12}$ alkyl group and $C_1$-$C_{12}$ alkylphenyl-$C_1$-$C_{12}$ alkyl group.

As the above formula (1-1), the following structures are preferable.

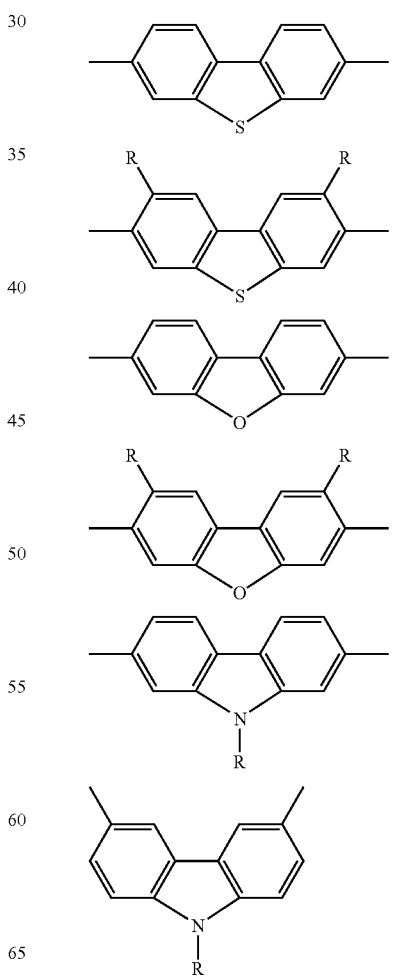

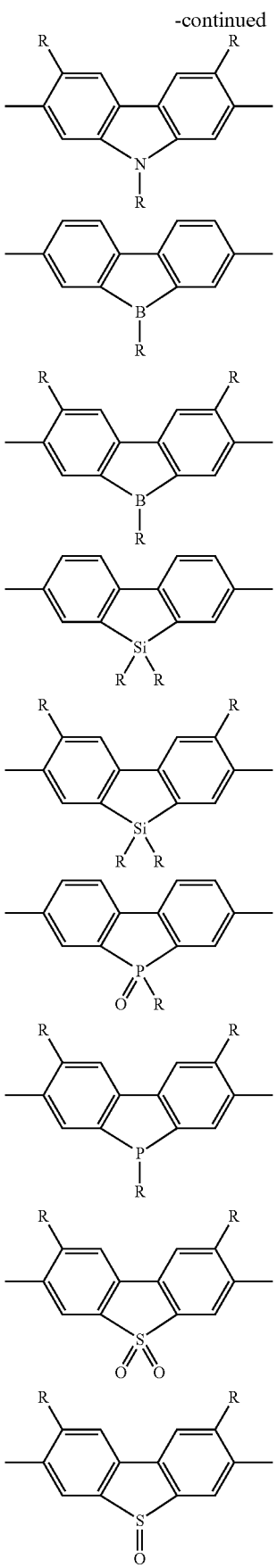
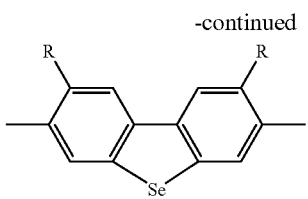
As R in the above formula, the Rs mentioned above are exemplified, and alkyl group, alkoxy group, aryl group, and aryloxy group are preferable.
Specific examples of the above formula (1-1) include the following structures:
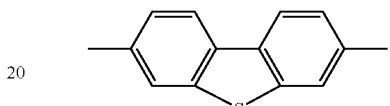
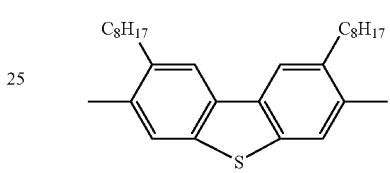
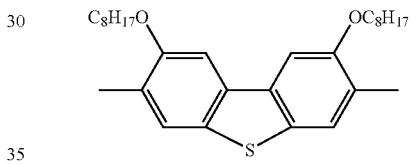
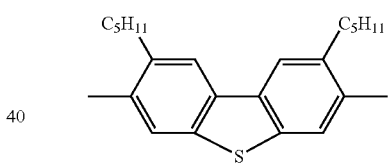
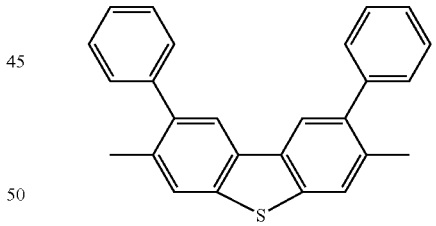
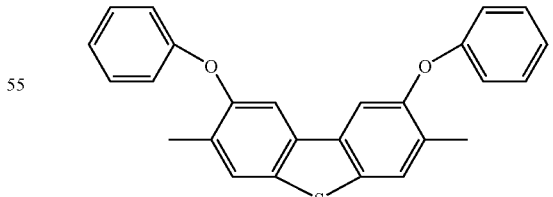
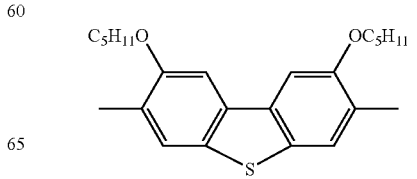

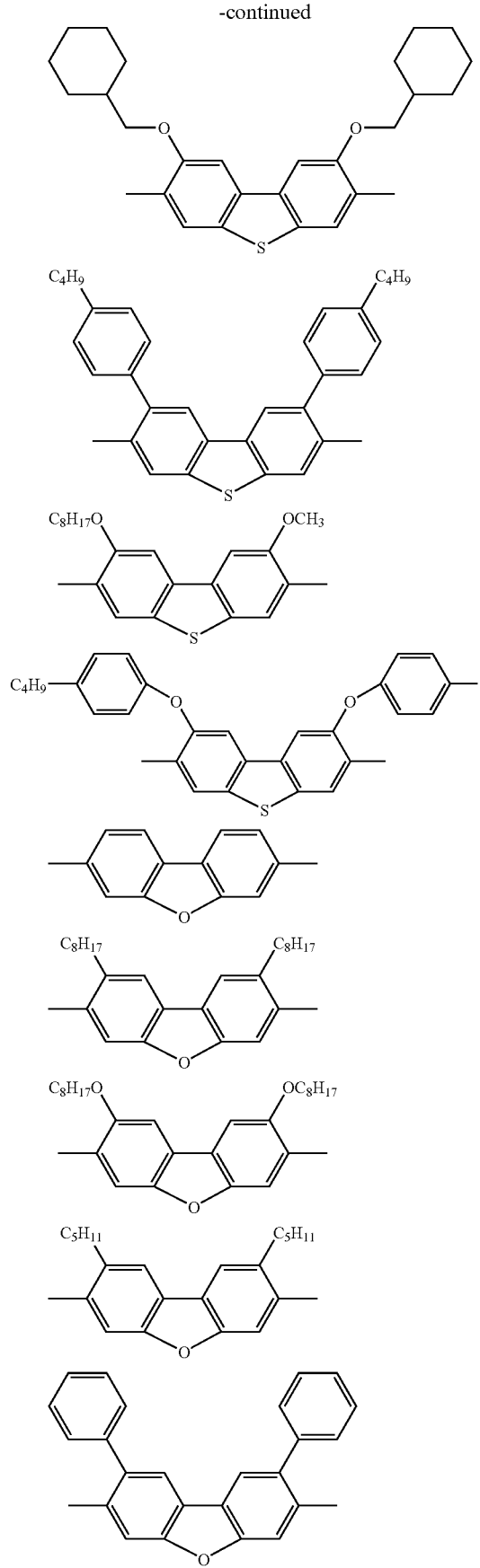
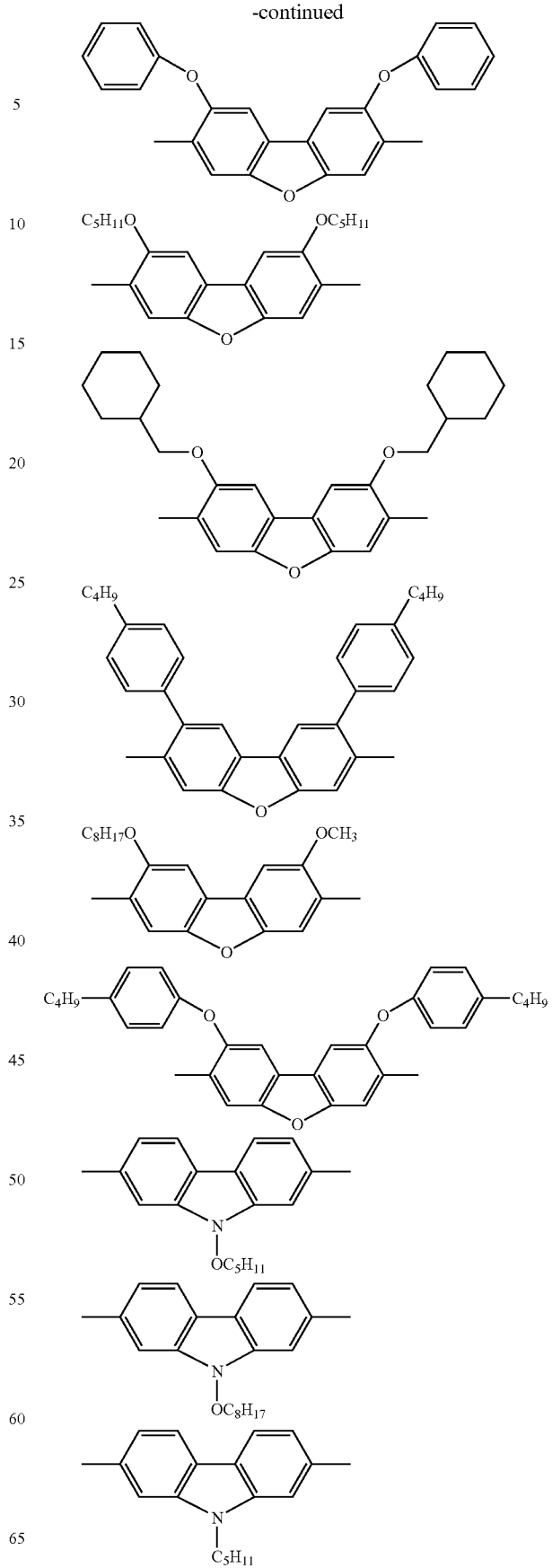

-continued
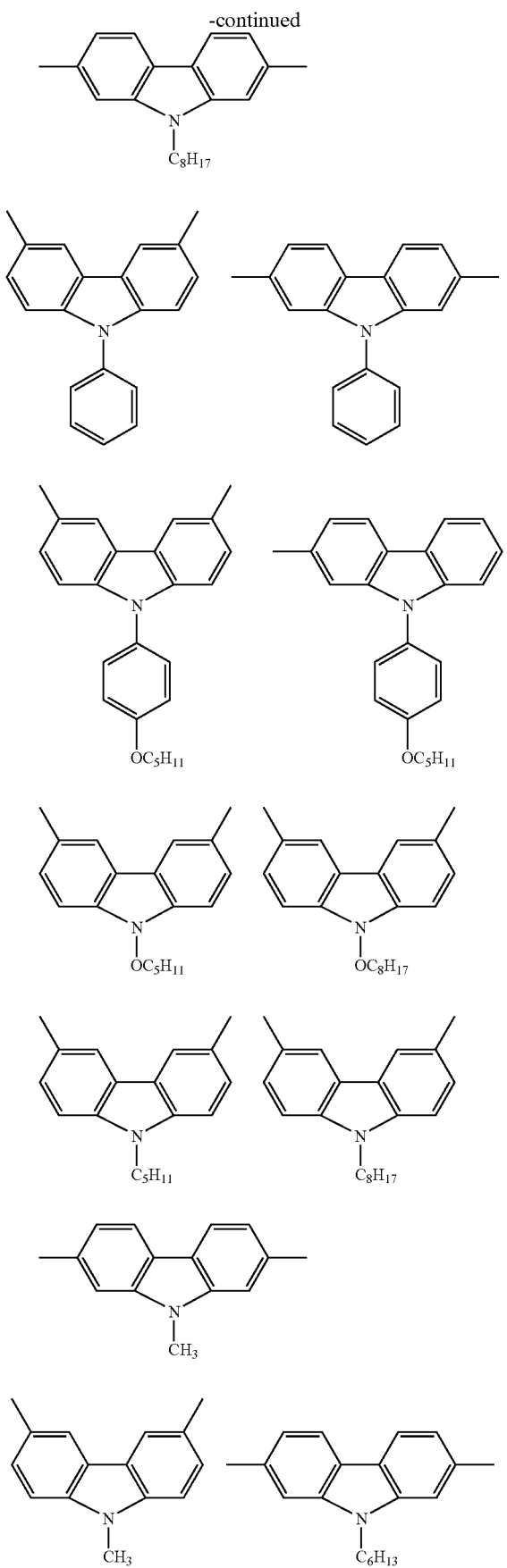

-continued
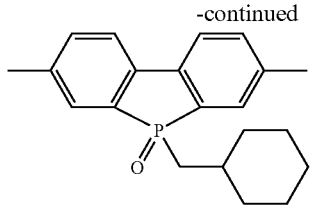
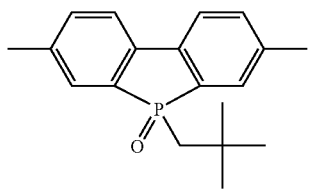
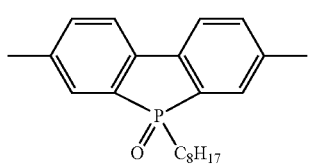
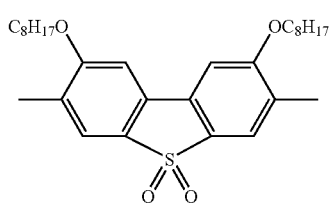
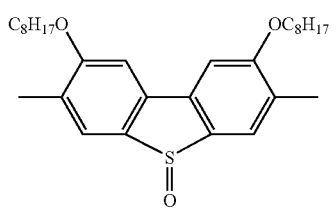
The above formula (1-2) preferably has the following structures:
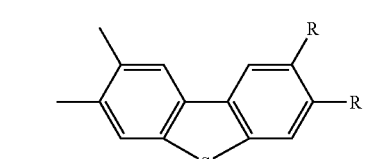
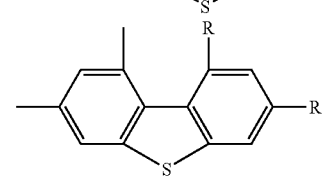
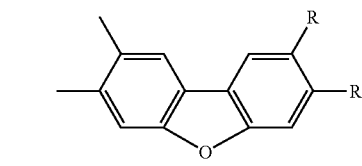
-continued
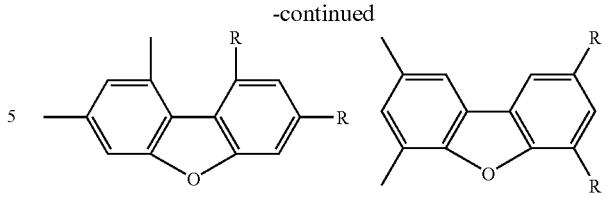
The R in the above formula is exemplified with the R mentioned above, and preferably alkyl group, alkoxy group, aryl group, and aryloxy group.
Specific examples of the above formula (1-2) include the following structures:
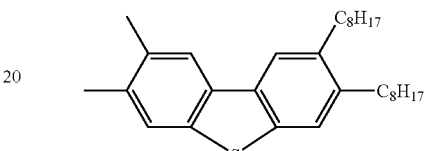
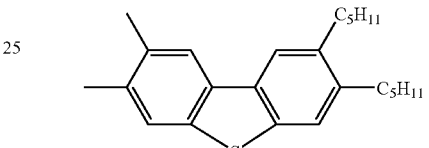
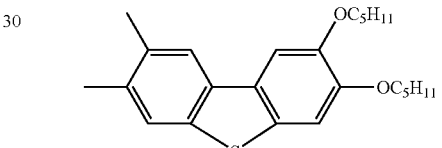
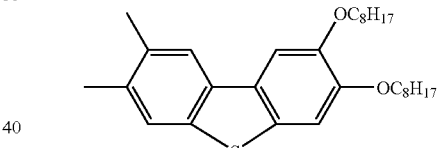
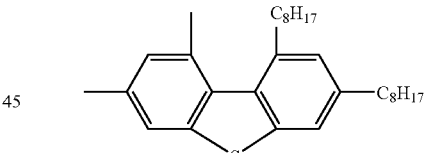
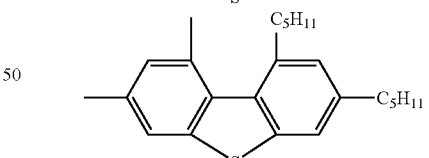
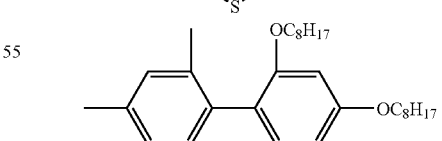
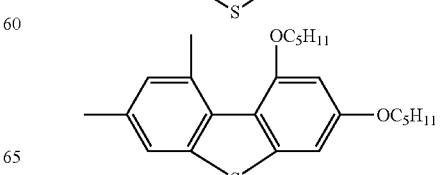

-continued
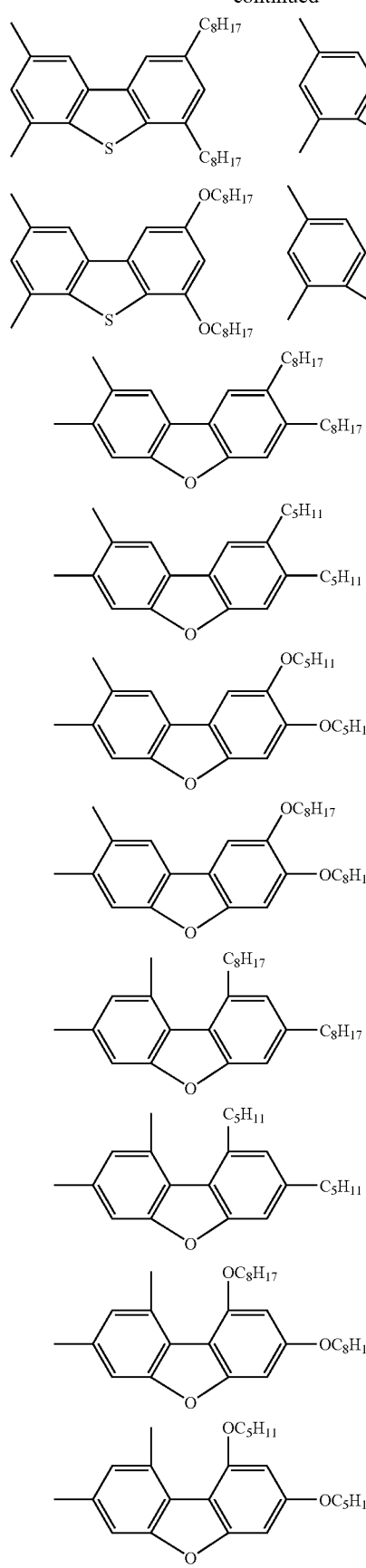
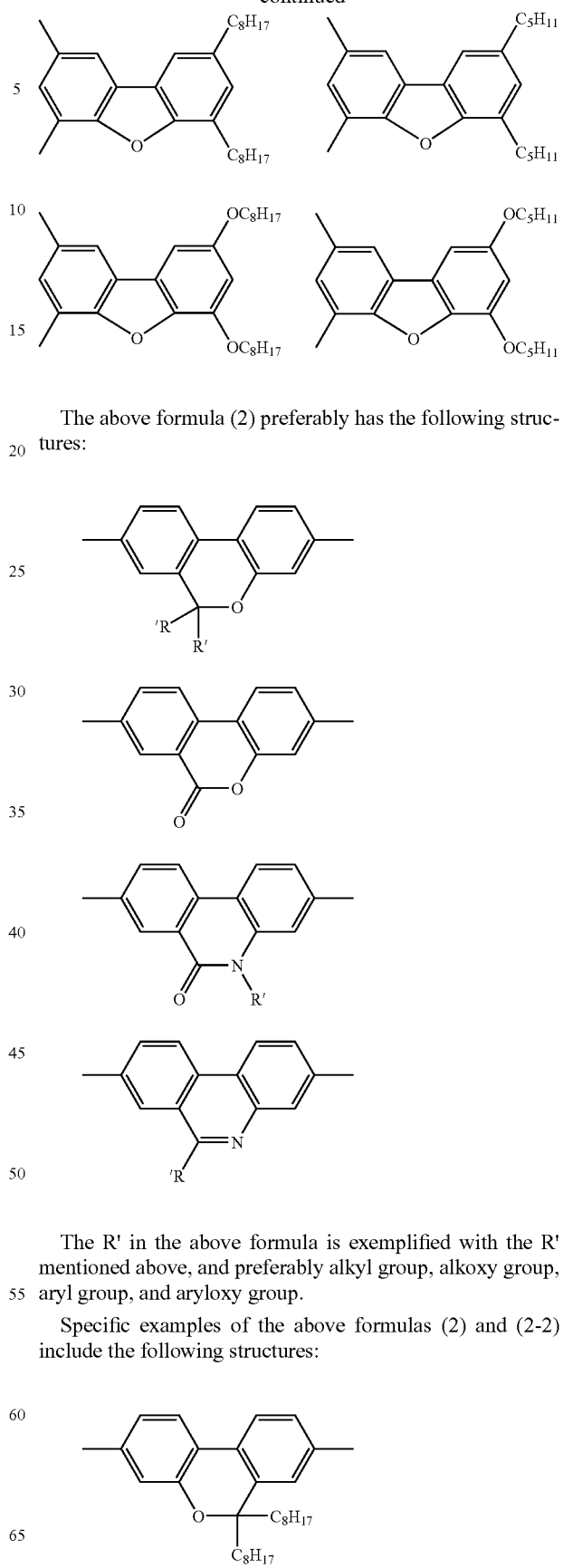
The above formula (2) preferably has the following structures:
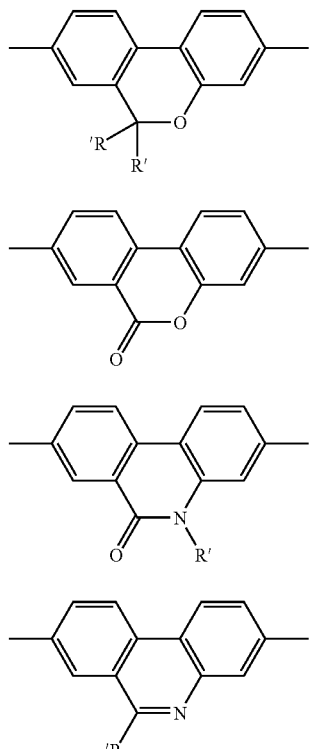
The R' in the above formula is exemplified with the R' mentioned above, and preferably alkyl group, alkoxy group, aryl group, and aryloxy group.
Specific examples of the above formulas (2) and (2-2) include the following structures:
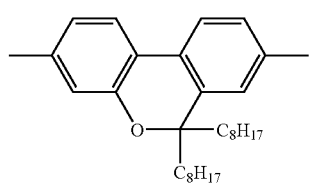

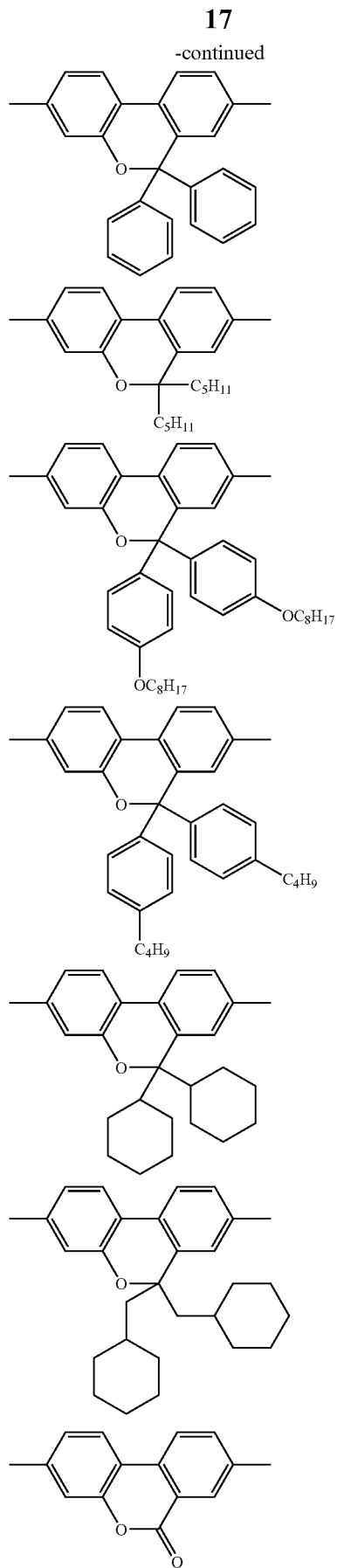
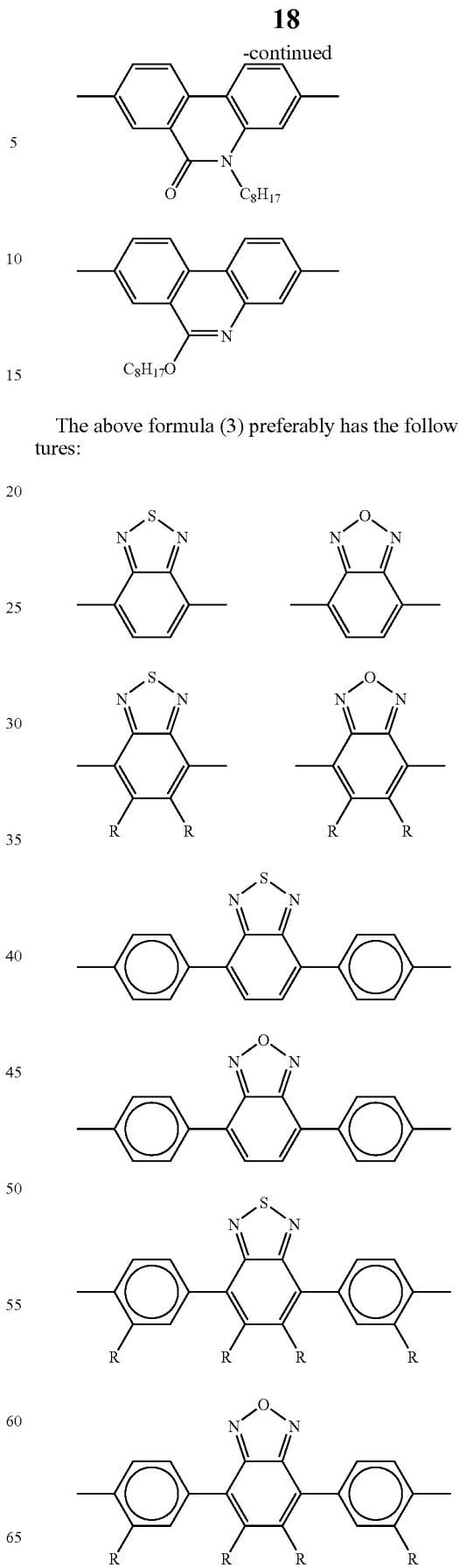
The above formula (3) preferably has the following structures:

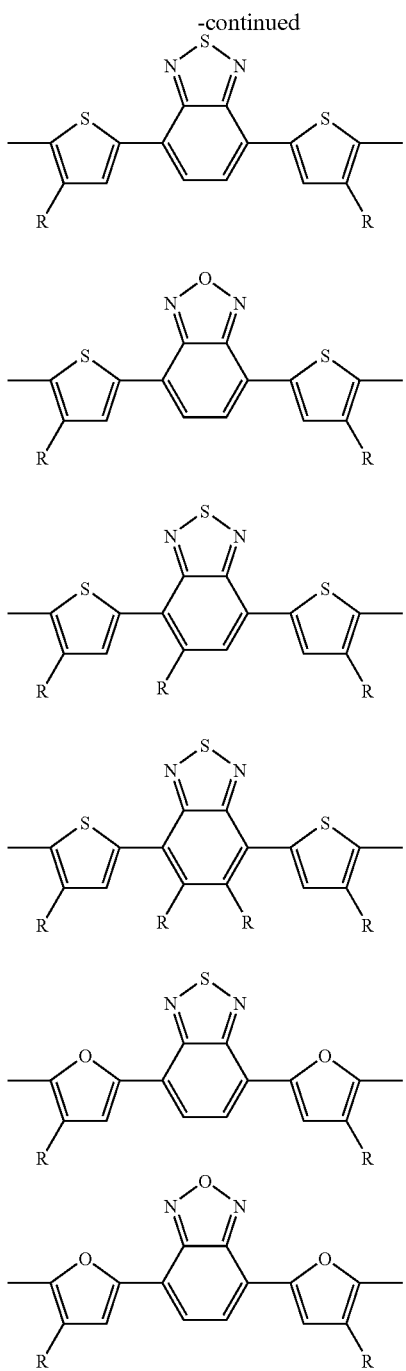
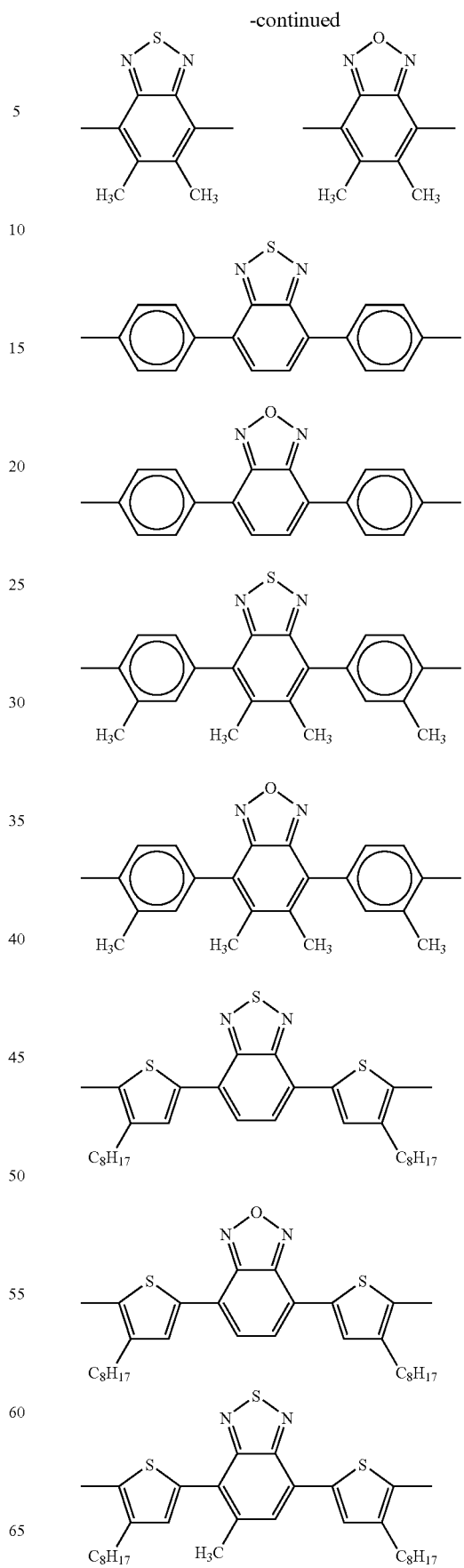
As R in the above formula, the Rs mentioned above are exemplified, and alkyl group, alkoxy group, aryl group, and aryloxy group are preferable.
Specific examples of the above formula (3) include the following structures:
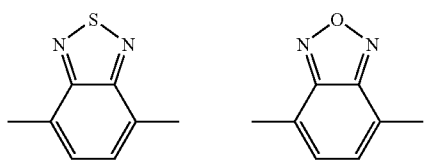

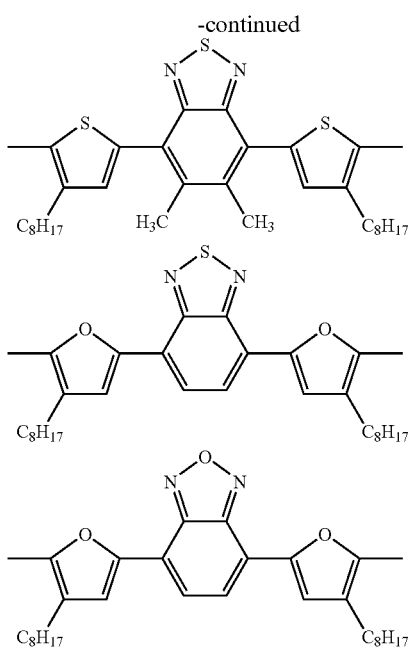
The above formula (4) preferably has the following structures:
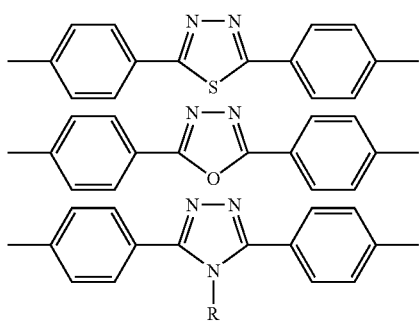
As R in the above formula, the Rs mentioned above are exemplified, and alkyl group, alkoxy group, aryl group, and aryloxy group are preferable.
Specific examples of the above formula (4) include the following structures:
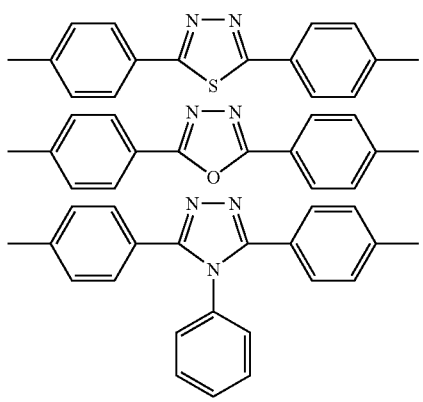
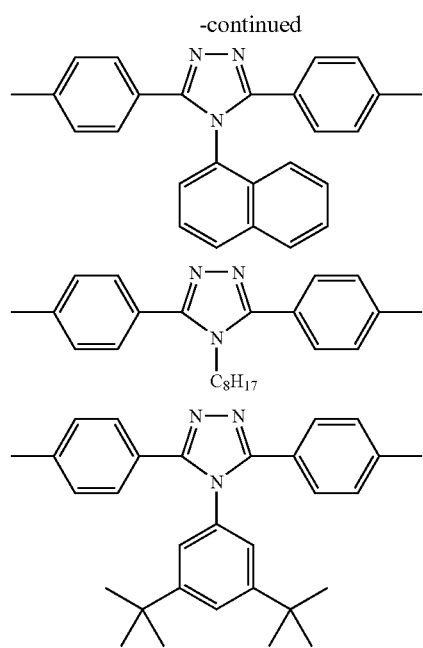
Specific examples of the above formulas (5-1), (5-2), (5-3), and (5-4) include the following structures:
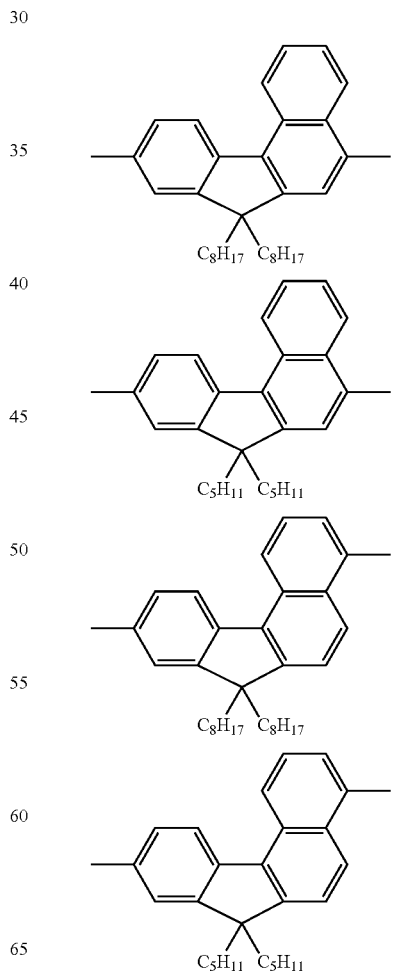

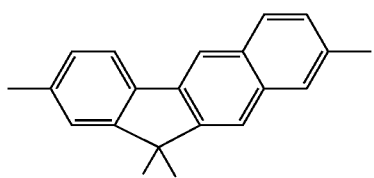

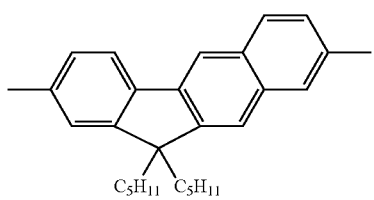

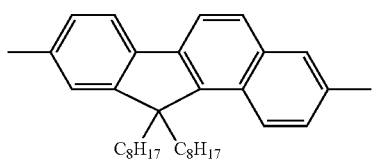

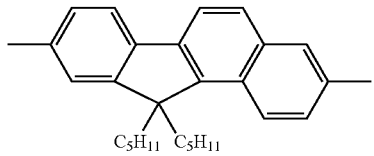

The arylene group usually has a carbon number of about 6 to 60, concrete examples thereof include phenylene group, naphtylene group, and anthracenediyl group. As the phenylene group, divalent residues in which two of Rs of the benzene mentioned above are removed are exemplified, as the naphtylene group, divalent residues in which two of Rs of the naphthalene mentioned above are removed are exemplified, and as the anthracenediyl group, divalent residues in which two of Rs of the anthracene mentioned above are removed are exemplified.

As the fluorenediyl group, a divalent residue in which two of Rs of the following structure are eliminated are exemplified.

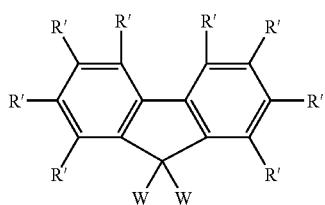

In the above formula, R' is exemplified with the R' mentioned above and two of R's are bonding links; W represents a hydrogen atom, alkyl group, aryl group, or monovalent heterocyclic group, and a plurality of Ws may be same or different each other.

Of the optionally substituted fluorenediyl group, the following structure is preferable:

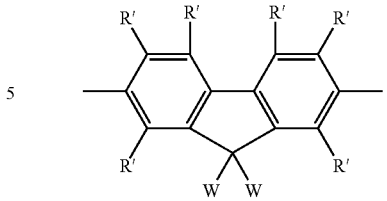

In the above structure, R' and W represent the same meanings mentioned above.

The monovalent heterocyclic group means an atomic group in which one hydrogen atom is removed from a heterocyclic compound, and usually has a carbon number of about 4 to 60, and preferably 4 to 20. The carbon number of the monovalent heterocyclic group does not include a carbon number of a substituent. The heterocyclic compounds, herein, mean organic compounds having a ring structure in which atoms constituting the ring include not only a carbon atom but also a hetero atom such as oxygen, sulfur, nitrogen, silicon, selenium, phosphor, and boron.

The monovalent heterocyclic group includes 5 membered heterocyclic group containing a hetero atom, 6 membered heterocyclic group containing a hetero atom, and a condensed heterocyclic group having 5 or 6 membered heterocyclic ring containing a hetero atom. The hetero atom includes nitrogen, oxygen, sulfur, silicon, selenium, phosphor, and boron, and preferably nitrogen, oxygen, and sulfur. Of the 6 membered heterocyclic groups containing a hetero atom, preferable is the one containing nitrogen as the hetero atom.

The 5 membered heterocyclic group containing a hetero atom, for example, includes the following groups:

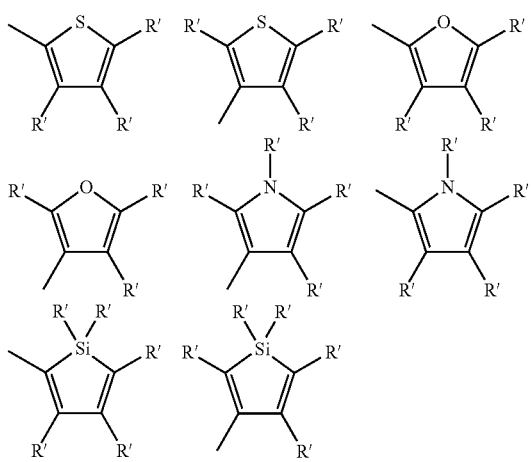

The 6 membered heterocyclic group containing a hetero atom, for example, includes the following groups:

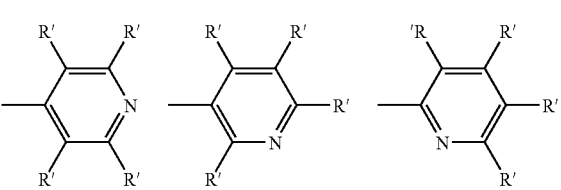

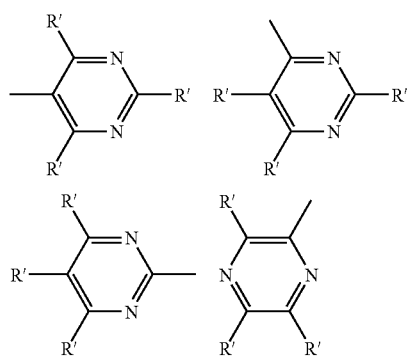
The condensed heterocyclic group having 5 or 6 membered heterocyclic group containing a hetero atom, for example, includes the following groups:
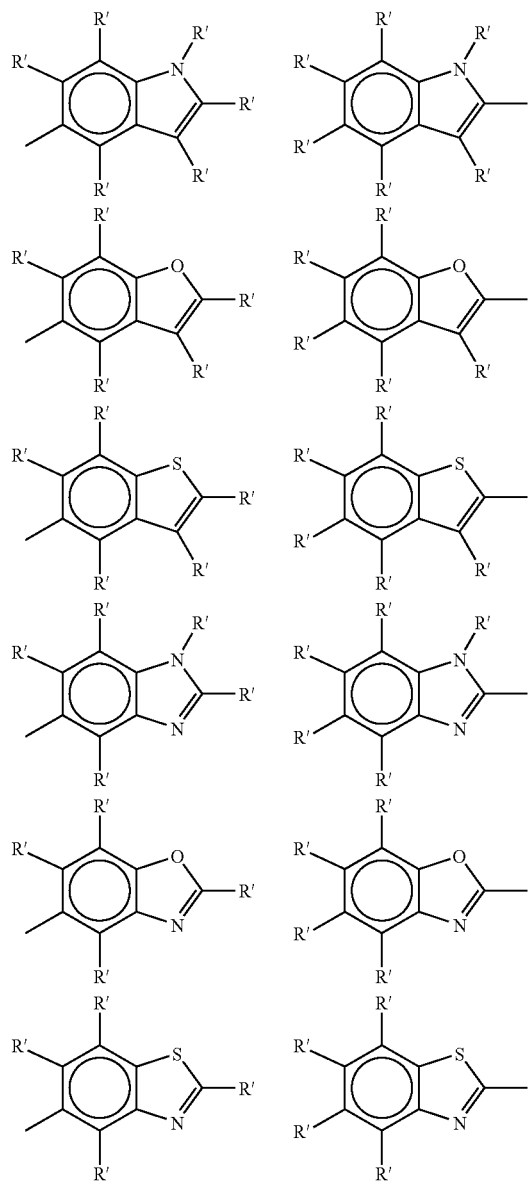
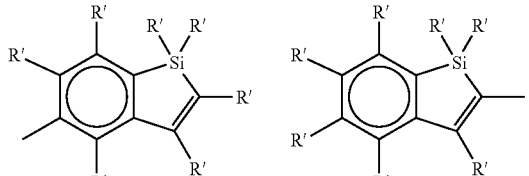
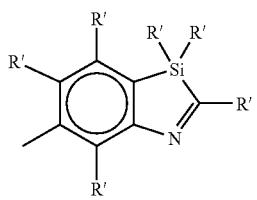
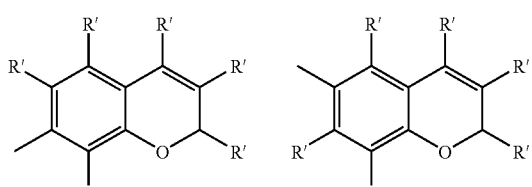
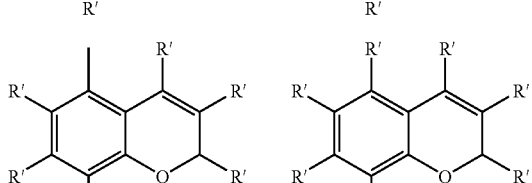
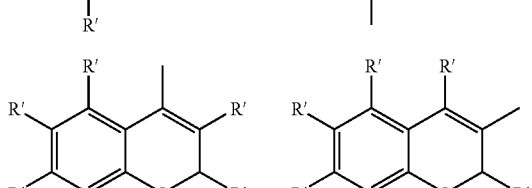
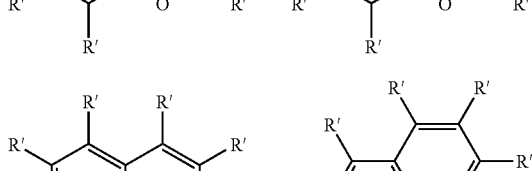
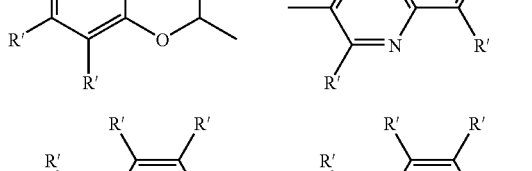
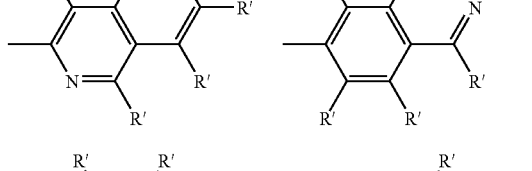
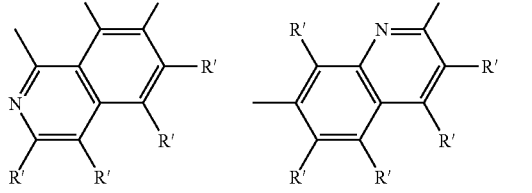

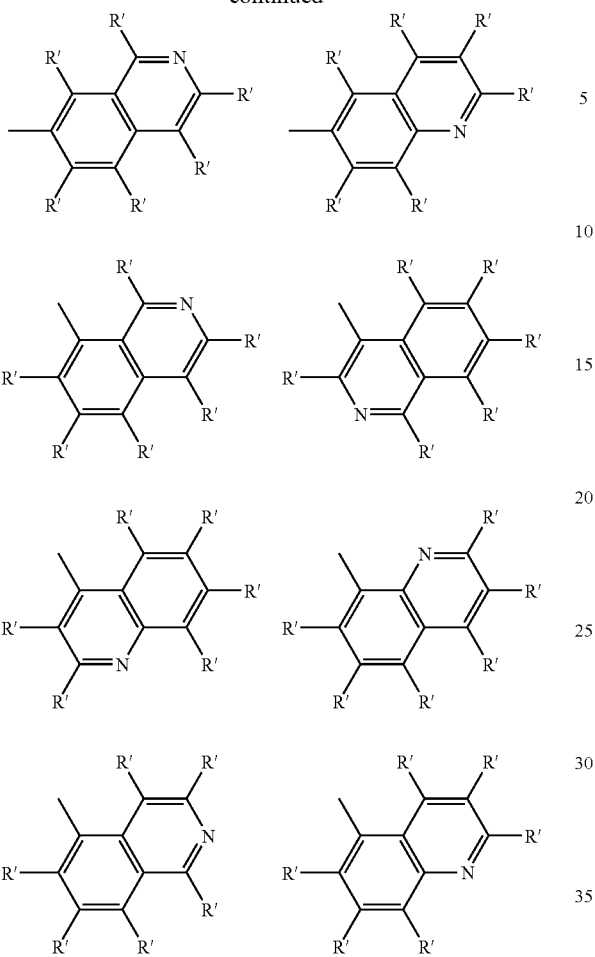

R' in the above monovalent heterocyclic group is exemplified with the R' mentioned above.

The divalent heterocyclic group is exemplified with a group in which another one R' is further removed from the above monovalent heterocyclic group.

The divalent aromatic amine group includes a structure represented by the following formula (6):

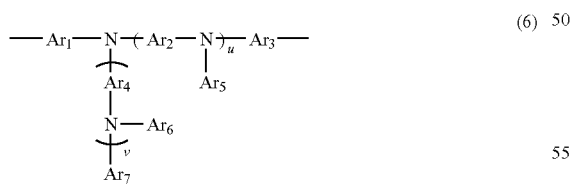

In the above formula, $Ar_1$, $Ar_2$, $Ar_3$, and $Ar_4$ each independently represent arylene group or divalent heterocyclic group. $Ar_5$, $Ar_6$, and $Ar_7$ each independently represent aryl group or monovalent heterocyclic group. $Ar_1$, $Ar_2$, $Ar_3$, $Ar_4$, and $Ar_5$ may have a substituent. u and v each independently represent an integer of 0 or 1, and satisfy $0=u+v=1$.

The divalent aromatic amine group preferably has the following structures:

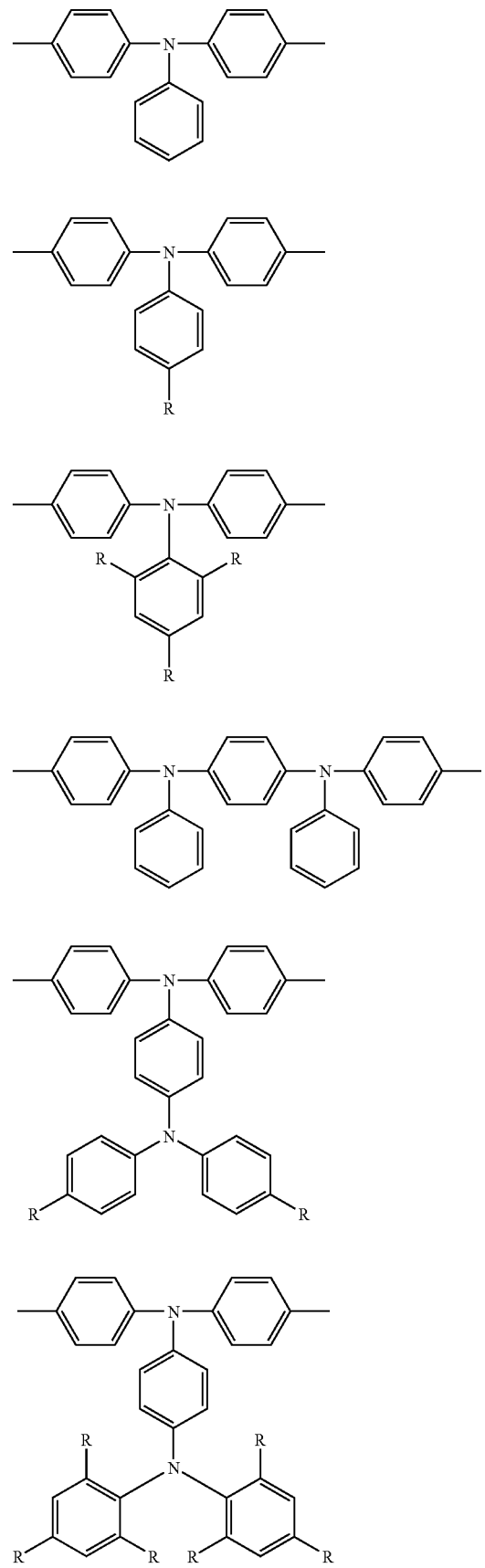

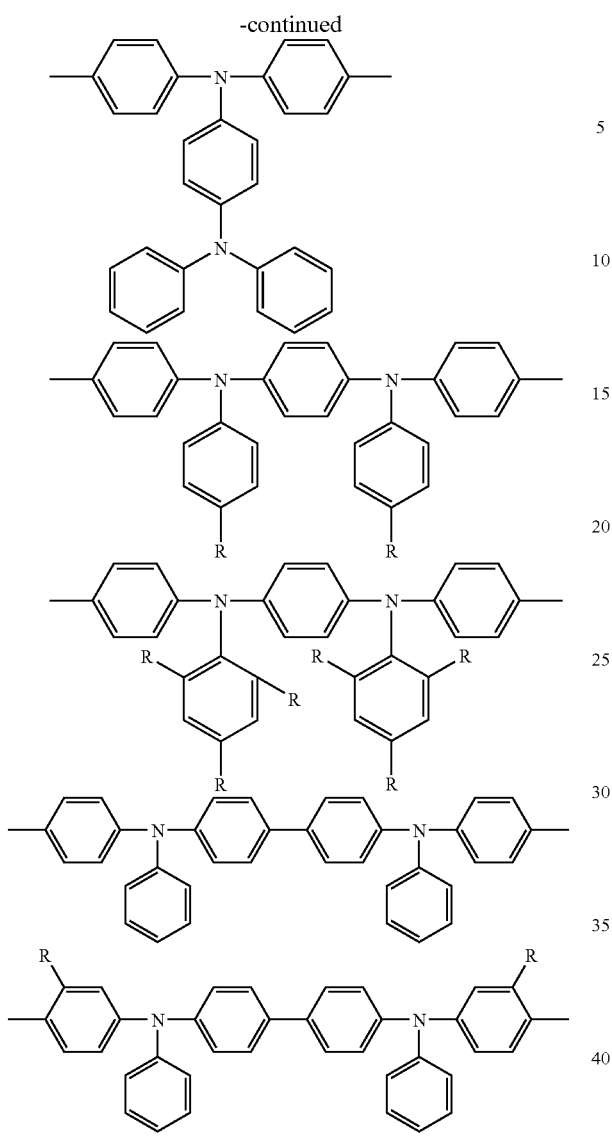
R in the above formulas is exemplified with the R mentioned above, and preferably alkyl group, alkoxy group, aryl group, and aryloxy group.
Specific examples of the divalent aromatic amine group are represented by the following structures:
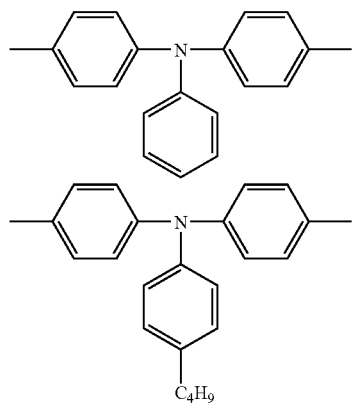
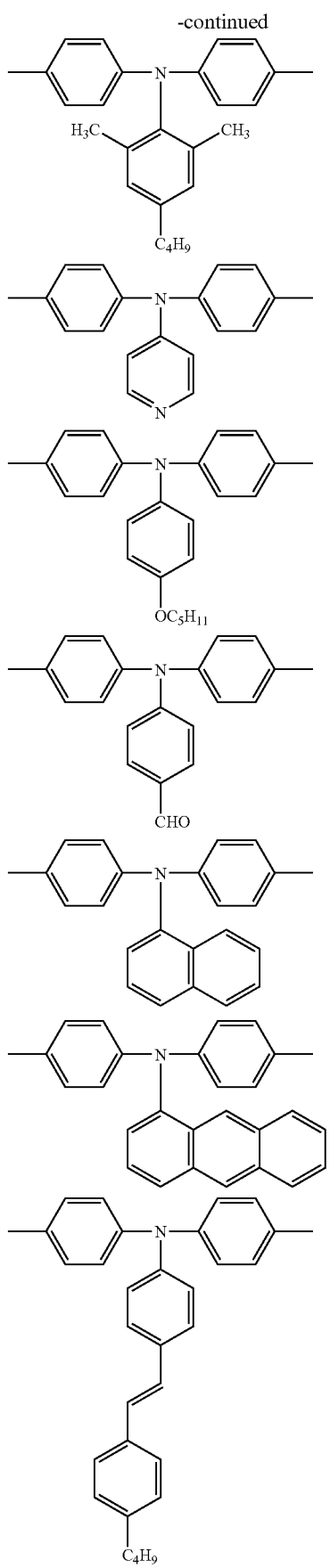

31
-continued
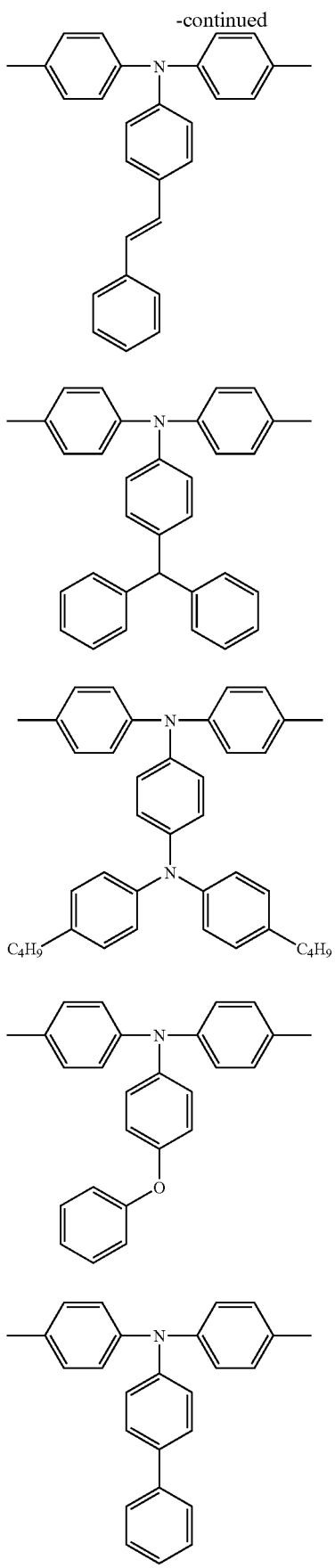
32
-continued
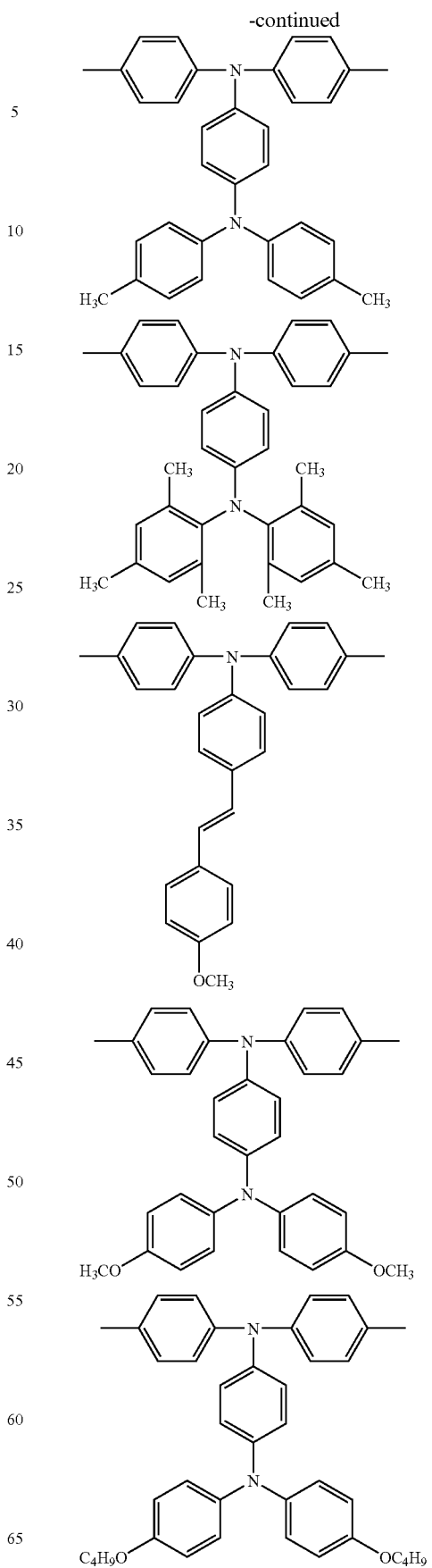

33
-continued
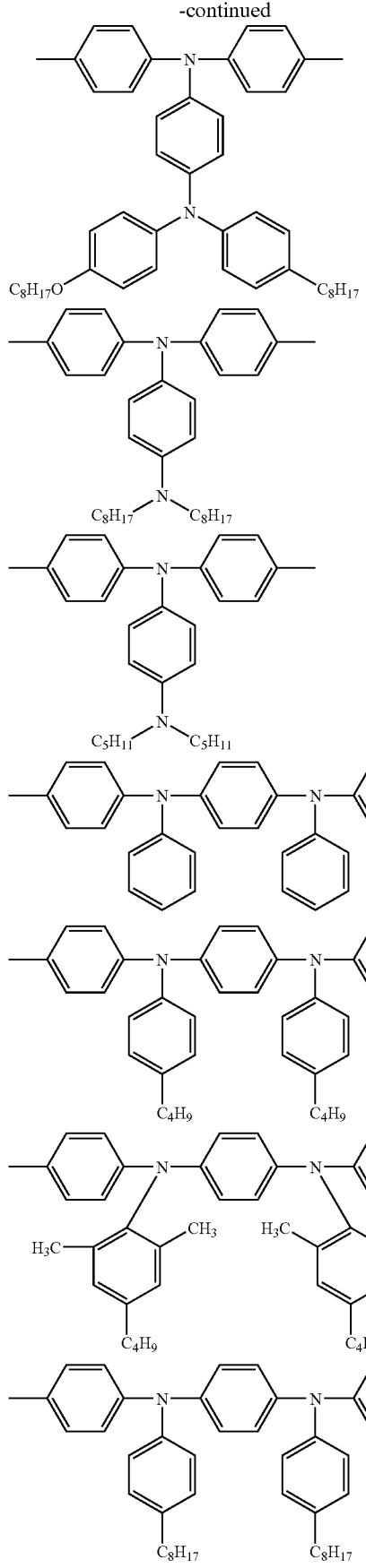
34
-continued
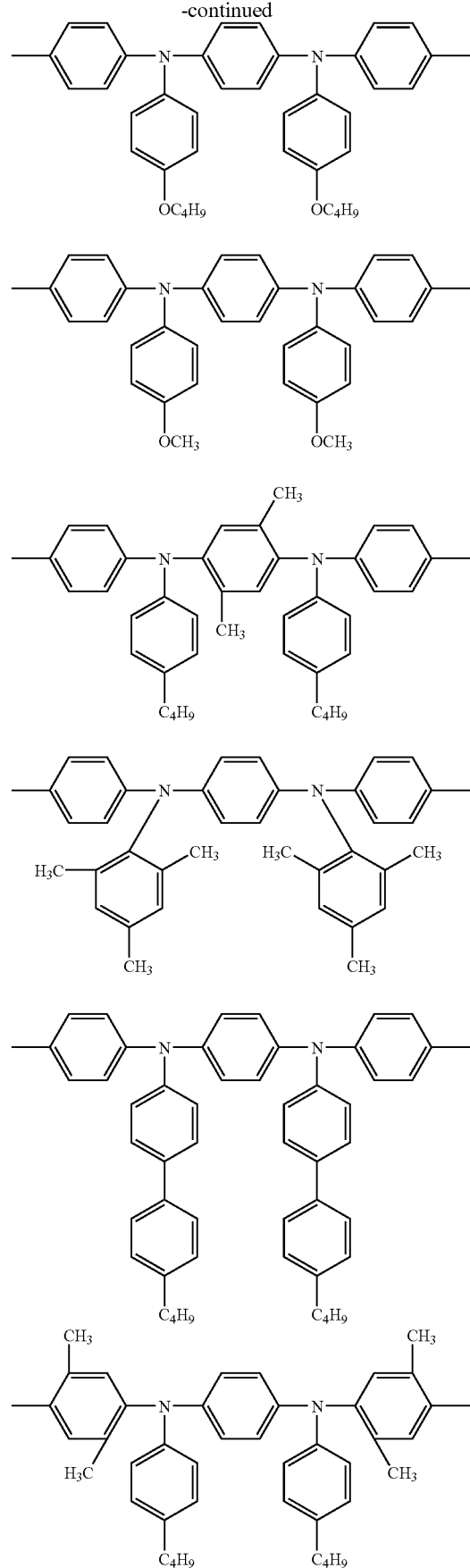

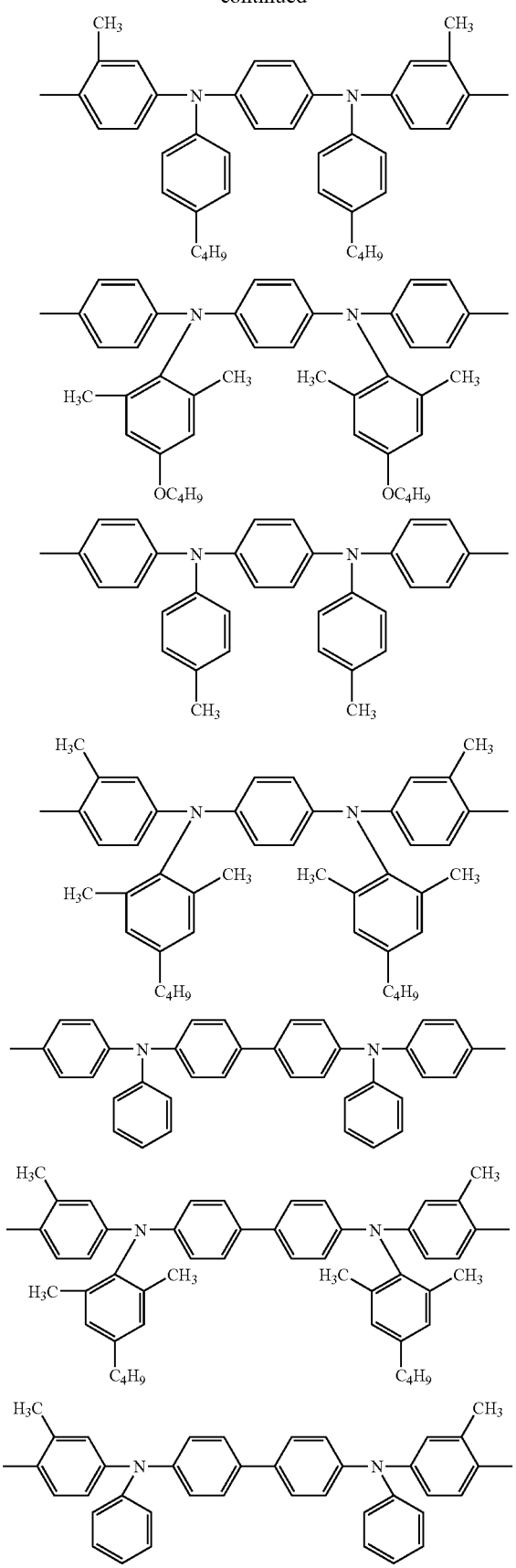
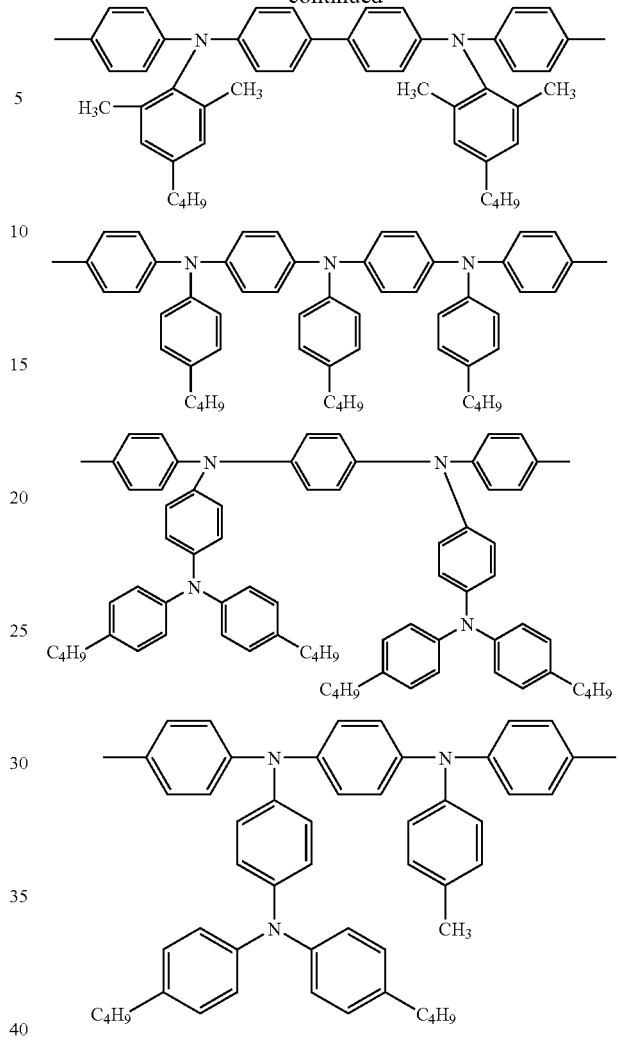

The polymer contained in the solution composition of the invention, as long as not spoiling fluorescence properties and charge injecting properties, may contain a repeating unit other than the above formulas (1-1), (1-2), (2), (2-2), (3), (4), (5-1), (5-2), (5-3), and (5-4), and arylene group, fluorenediyl group, divalent aromatic amine group, and divalent heterocyclic group. Regarding the repeating unit other than the above formulas (1-1), (1-2), (2), (2-2), (3), (4), (5-1), (5-2), (5-3), and (5-4), and arylene group, fluorenediyl group, divalent aromatic amine group, and divalent heterocyclic group, they are preferably 30% by moles or less based on the sum of total repeating units, more preferably 20% by moles or less, even more preferably 10% by moles or less, and still particularly preferably being not contained substantially.

The solution composition of the invention satisfies the characteristics desired for coating by inkjet method, the characteristics being not only the viscosity thereof but also the properties that a polymer concentration in the composition is 1% by weight or less, a film formed therefrom has a high toughness, viscosity change thereof is small after long preservation, a nozzle of an inkjet printer is never clogged, and a film formed from the composition emits light with strong intensity.

The polymer used for the solution composition of the invention can be produced, for example, by reacting a monomer represented by the general formulas (7), (8), and (9) and/or (10):

$$K_1—Ar_{11}—K_2 \quad (7)$$

$$K_3—Ar_{12}—K_4 \quad (8)$$

$$K_5-L_1 \quad (9)$$

$$K_6-L_2 \quad (10)$$

(wherein $Ar_{11}$ and $Ar_{11}$ each independently represent optionally substituted fluorenediyl group. $L_1$ and $L_2$ represent a terminal group respectively. $K_1$, $K_2$, $K_3$, $K_4$, $K_5$, and $K_6$ each independently represent a leaving group. $L_1$ and $L_2$ are different each other).

The polymer used for the solution composition of the invention, in order to increase the molecular weight thereof, may be polymerized with containing a monomer represented by the formula (11) which has three leaving groups:

$$K_1—Ar_{11}(—K_7)—K_2 \quad (11)$$

(wherein $Ar_{11}$ represents the substituent mentioned above, and $K_1$, $K_2$, and $K_7$ each independently represent a leaving group).

The polymer is preferably a polymer produced by removing leaving groups of a monomer having two leaving groups, 99.9 to 99.5% by mole, and a monomer having three leaving groups, 0.1 to 0.5% by mole.

In order to increase the molecular weight of a polymer used for a solution composition of the invention, other than the monomers represented by the formulas (7) to (11), a monomer having four leaving groups may be included for the polymerization.

Examples of the leaving group include a halogen atom, alkylsulfonyloxy group, arylsulfonyloxy group, or a group represented by —B(OR$_{11}$)$_2$ (wherein R$_{11}$ is a hydrogen atom or alkyl group).

Examples of the halogen atom includes a chlorine atom, bromine atom, and iodine atom, preferably a chlorine atom and bromine atom, and more preferably a bromine atom. The alkylsulfonyloxy group may be substituted with a fluorine atom, and examples thereof include trifluoromethanesulfonyloxy group and the like. The arylsulfonyloxy group may be substituted with alkyl group, and examples thereof include phenylsulfonyloxy group, trisulfonyloxy group, and the like.

In the group represented by —B(OR$_{11}$)$_2$, R$_{11}$ is a hydrogen atom or alkyl group. The alkyl group usually has a carbon number of about 1 to 20, and examples thereof include methyl group, ethyl group, propyl group, butyl group, hexyl group, octyl group, dodecyl group, and the like. The alkyl groups may be connected each other to form a ring.

Concrete examples of the groups represented by —B(OR$_{11}$)$_2$ include the followings,

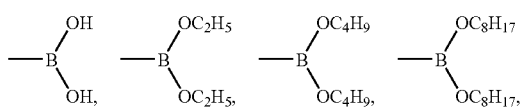

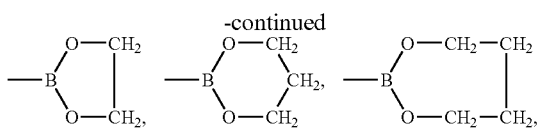

and preferably include the followings,

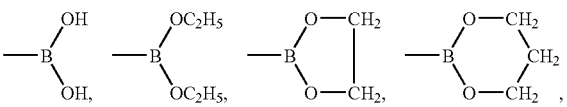

When the monomer represented by the general formula (11) is not contained, the total supplied amount of the monomers represented by the general formulas (9) and (10) is usually 0.1 to 10% by mole with respect to the total supplied amount of the monomers represented by the general formulas (7) and (8), preferably 0.2 to 5% by mole, and more preferably 0.5 to 3% by mole.

When the monomer represented by the general formula (11) is contained, this may cause problems that, if an amount of the monomer represented by the general formula (11) is too small, the effect of increasing a molecular weight is small, and if being too large, the resultant polymer becomes difficult to dissolve in widely-used solvents. The total supplied amount of the monomers represented by the general formulas (9) and (10) is typically 0.1 to 10% by mole with respect to the total supplied amount of the monomers represented by the general formulas (7), (8), and (11), preferably 0.2 to 5% by mole, and more preferably 0.5 to 3% by mole. The supplied amount of the monomer represented by the general formula (11) is preferably 0.05 to 1.0% by mole with respect to the total supplied amount of the monomers represented by the general formulas (7), (8), and (11), and more preferably 0.1 to 0.5% by mole.

As the method for producing the polymer used in the invention, exemplified are: a method of polymerization from the corresponding monomers mentioned above by Suzuki's reaction (Chem. Rev., Vol. 95, page 2457 (1995)), a method of polymerization by Grignard reaction (KYORITSU SHUPPAN CO., LTD. KOUBUNSI KINOUZAIRYOU SERIES Vol. 2, KOUBUNSI NO GOUSEI TO HANNOU(2), page 432-3), a method of polymerization by Yamamoto's polymerization method (Prog. Polym. Sci., Vol. 17, page 1153-1205, 1992), a method of polymerization by using an oxidizing agent such as FeCl$_3$, and electrochemical oxidative polymerization (MARUZEN CO., LTD., JIKKEN KAGAKU KOUZA fourth edition, Vol. 28, page 339-340).

The case of using Suzuki's reaction is explained. In this case, employing monomers wherein $K_1$ and $K_2$ are each independently the group represented by —B(OR$_{11}$)$_2$ (wherein R$_{11}$ is a hydrogen atom or alkyl group), $K_3$ and $K_4$ are each independently a halogen atom, alkylsulfonyloxy group, or arylsulfonyloxy group, $K_5$ is the group represented by —B(OR$_{11}$)$_2$ (wherein R$_{11}$ is a hydrogen atom or alkyl group), and $K_6$ is a halogen atom, alkylsulfonyloxy group, or arylsulfonyloxy group; these monomers are reacted in the presence of Pd(0) catalyst to produce a polymer.

In this case, in a reaction requiring two or more monomers having two leaving groups wherein at least one of the monomers is the monomer having two —B(OR$_{11}$)$_2$s (wherein R$_{11}$ is a hydrogen atom or alkyl group) and at least other one of the monomers is the monomer having two units selected from the group of a halogen atom, alkylsulfonyloxy group, and arylsulfonyloxy group, usually monomers represented by formulas (7) and (8) are reacted for about 1 to 100 hours, then monomer (9) is added in the reaction system, and further reacted for about 0.5 to 50 hours, and then monomer (10) is added in the reaction system to react for about 0.5 to 50 hours.

The reaction is conducted, for example, with using palladium[tetrakis(triphenylphosphine)] or palladium acetate as a Pd(0) catalyst, and adding an inorganic base such as potassium carbonate, sodium carbonate, and barium hydroxide, organic base such as triethylamine, and inorganic salt such as cesium fluoride in an amount of equivalent or more per monomer, and preferably 1 to 10 equivalent. The reaction may be conducted in a two-phase system with using an aqueous solution of an inorganic salt. As the solvent to be used, exemplified are N,N-dimethylformamide, toluene, dimethoxyethane, and tetrahydrofuran. A reaction temperature is preferably about 50 to 160° C. depending on the solvent used. It may be heated near to the boiling point of the solvent and refluxed. The reaction time is about 1 hour to 200 hours.

The case of using Yamamoto's polymerization is explained. In this case, for example, employing monomers wherein $K_1$, $K_2$, $K_3$, $K_4$, $K_5$, $K_6$, and $K_7$ are each independently a halogen atom, alkylsulfonyloxy group, or arylsulfonyloxy group; these monomers are reacted in the presence of Ni(0) complex to produce a polymer. The reaction is usually conducted by mixing all of monomers (7) to (11).

One method is to use a Ni(0) complex (zero-valent nickel complex), and as the nickel complex, a zero-valent nickel is used as itself, and another method is to react a nickel salt in the presence of a reducing agent and generate a zero-valent nickel in situ. As the zero-valent nickel complex, bis(1,5-cyclooctadiene)nickel(0), (ethylene)bis(triphenylphosphine)nickel(0), and tetrakis(triphenylphosphine)nickel are exemplified, and among of them bis(1,5-cyclooctadiene)nickel(0) is preferable in view of versatility and low cost. Furthermore, addition of a neutral ligand is preferable in view of enhancing a yield. The neutral ligand means a ligand having neither an anion nor a cation, examples thereof include nitrogen containing ligands such as 2,2'-bipyridyl, 1,10-phenanthroline, methylenebisoxazoline, and N,N-tetramethylethylenediamine; and tertiary phosphine ligands such as triphenylphosphine, tritolylphosphine, tributylphosphine, and triphenoxyphosphine; and nitrogen containing ligands being preferable in view of versatility and low cost, and 2,2'-bipyridyl being particularly preferable in view of high reactivity and high yield. In view of enhancing a yield of a polymer, particularly preferable is a system in which the system containing bis(1, 5-cyclooctadiene)nickel(0) is added with 2,2'-bipyridyl as a neutral ligand. In the method of reacting a zero-valent nickel in situ, as the nickel salt, nickel chloride and nickel acetate are exemplified. As the reducing agent, zinc, sodium hydride, hydrazine and derivatives thereof, lithium aluminum hydride, etc. are exemplified; and, if required, as the additive, such as ammonium iodide, lithium iodide, and potassium iodide may be used. A solvent for polymerization is not particularly limited as long as not inhibiting the polymerization, and being preferably the one containing one or more kind(s) of aromatic hydrocarbon solvent and/or ether solvent. Examples of the aromatic hydrocarbon solvent include benzene, toluene, xylene, trimethylbenzene, tetramethylbenzene, butylbenzene, naphthalene, and tetralin; and preferably being toluene, xylene, tetralin, and tetramethylbenzene. Examples of the ether solvent include diisopropyl ether, tetrahydrofuran, 1,4-dioxane, diphenyl ether, ethyleneglycoldimethyl ether, and tert-butylmethyl ether, and preferably tetrahydrofuran and 1,4-dioxane which are a good solvent to polymer compounds. Among the solvents, tetrahydrofuran is most preferable. Furthermore, in view of improving polymerization ability and solubility, the solvent, as long as not inhibiting the polymerization, may use a solvent of the aromatic hydrocarbon solvent and/or ether solvent mixed with a solvent other than the aromatic hydrocarbon solvent and ether solvent. Reaction procedures and the like may be conducted, for example, according to a method disclosed in Kokai No. 2000-44544. In Yamamoto's polymerization, the polymerization reaction, for example, is usually conducted under an inert gas atmosphere such as argon or nitrogen, in the solvent of tetrahydrofuran, at a temperature of 60° C., and in the presence of a zero-valent nickel complex and neutral ligand. A polymerization time is usually about 0.5 to 100 hours, and preferably 10 hours or less in view of production cost. The polymerization temperature is usually about 0 to 200° C., and preferably 20 to 100° C. in view of high yield and saving heating cost.

When a neutral ligand is used, the amount is preferably about 0.5 to 10 moles with respect to 1 mole of the zero-valent nickel complex in view of reaction yield and cost, more preferably 0.8 to 1.5 moles, and even more preferably 0.9 to 1.1 moles.

The amount of zero-valent nickel complex to be used is not particularly limited as long as not inhibiting the polymerization; if the amount is too small, a resulting molecular weight tends to become smaller; if being too large, after-treatments tend to become troublesome; therefore, the amount is preferably 0.1 to 10 moles with respect to 1 mole of a monomer, more preferably 1 to 5 moles, and even more preferably 2 to 3.5 moles.

When the polymer is used as a light-emitting material of polymer LEDs, the polymerization is preferably conducted after purifying un-reacted monomers with distillation, sublimation, re-crystallization, and the like; moreover, after the polymerization, the polymer may be subjected to purification treatment such as re-precipitation or fractionation with chromatography.

The polymer contained in the solution composition of the invention may be one kind or 2 or more kinds thereof; in order to sharing various functions such as transporting charge and light emission, preferably being 2 or more kinds of polymers. In view of cost, the polymer contained in the solution composition is preferably 2 to 3 kinds thereof, and more preferably 2 kinds.

When the solution composition of the invention contains 2 or more kinds of polymers, at least one of polymers must be the polymer emitting fluorescence in the solid state. When 2 kinds of polymers are contained, in view of characteristics of a device, the following cases are preferable: containing a polymer having the above formula (1-1) as a repeating unit thereof and a polymer having divalent aromatic amine group as a repeating unit thereof; containing a polymer having the above formula (1-1) as a repeating unit thereof and a polymer having the above formula (5-1) as a repeating unit thereof; containing a polymer having the above formula (1-1) as a repeating unit thereof and a polymer having the above formula (5-2) as a repeating unit thereof; containing a polymer having the above formula (5-1) as a repeating unit thereof and a polymer having divalent aromatic amine group as a repeating unit thereof; containing a polymer having the above formula (5-2) as a repeating unit thereof and a polymer having divalent aromatic amine group as a repeating unit thereof; containing a polymer having fluorenediyl group as a repeating unit thereof and a polymer having divalent aromatic amine group as a repeating unit thereof; and containing a polymer having the above formula (1-1) as a repeating unit thereof and a polymer having fluorenediyl group as a repeating unit thereof.

The solvent used for the solution composition of the invention is usually an organic solvent, and examples thereof include aromatic hydrocarbon solvents, aliphatic hydrocarbon solvents, alcohol solvents, glycol solvents, ester solvents, aldehyde solvents, ketone solvents, carboxyl solvents, acetate solvents, ether solvents, nitrogen containing solvents, and sulfur containing solvents.

Examples of the aromatic hydrocarbon solvents include benzene, alkylbenzenes, naphthalene, alkylnaphthalenes, anthracene, phenanthrene, and the like. The alkylbenzenes are exemplified with toluene, o-xylene, p-xylene, m-xylene, mesitylene, 1,2,4-trimethylbenzene, tetramethylbenzene, ethylbenzene, n-propylbenzene, i-propylbenzene, n-butylbenzene, s-butylbenzene, i-butylbenzene, t-butylbenzene, n-pentylbenzene, n-hexylbenzene, n-heptylbenzene, n-octylbenzene, n-nonylbenzene, n-decylbenzene, o-diethylbenzene, m-diethylbenzene, p-diethylbenzene, 1,2,4-triethylbenzene, 1,3,5-triethylbenzene, tetraethylbenzene, o-ethylmethylbenzene, p-ethylmethylbenzene, m-ethylmethylbenzene, di-n-propylbenzene, di-i-propylbenzene, tri-n-propylbenzene, ethyl-n-propylbenzene, ethyl-i-propylbenzene, ethyl-n-propylbenzene, methyl-i-propylbenzene, methyl-n-propylbenzene, cyclohexylbenzene, tetralin, methyltetralin, styrene, biphenyl, indene, and fluorene. The alkylnaphthalenes are exemplified with a-methylnaphthalene, β-methylnaphthalene, a-ethylnaphthalene, β-ethylnaphthalene, n-propylnaphthalene, and 1,4-dimethylnaphtalene.

Examples of the aliphatic hydrocarbon solvents include n-pentane, isopentane, n-hexane, isohexane, n-heptane, isoheptane, n-octane, isooctane, nonane, n-decan, n-undecane, n-dodecane, isododecane, n-tridecane, n-tetradecane, cyclopentane, cyclopentene, cyclohexane, methylcyclohexane, dimethylcyclohexane, ethylcyclohexane, cyclohexene, cycloheptane, decalin, and norbornane.

Examples of the alcohol solvents include aliphatic alcohol solvents and aromatic alcohol solvents. The aliphatic alcohol solvents are exemplified with methanol, ethanol, i-propanol, n-propanol, i-butanol, n-butanol, t-butanol, s-butanol, 3-methoxy-1-butanol, n-pentanol, 3-methyl-1-butanol, n-hexanol, n-heptanol, n-octanol, 2-ethyl-1,3-hexyldiol, 2-ethyl-1-hexanol, n-nonylalcohol, n-decanol, isodecylalcohol, isotridecylalcohol, 4-hydroxy-4-methyl-2-pentanone, methylisobutylcarbinol, cyclopentanol, cyclohexanol, methylcyclohexanol, cyclohexenol, cyclohexylmethanol, tetrahydrofurfurylalcohol, and furfuryl alcohol. The aromatic alcohol solvents are exemplified with phenol, o-cresol, m-cresol, p-cresol, o-ethylphenol, m-ethylphenol, p-ethylphenol, 2,3-xylenol, 2,6-xylenol, 3,4-xylenol, 3,5-xylenol, 4-methoxyphenol, o-t-butylphenol, p-t-butylphenol, 2,4-di-t-butylphenol, 2,6-di-t-butylphenol, 2-methyl-6-t-butylphenol, o-phenylphenol, m-phenylphenol, p-phenylphenol, a-naphthol, β-naphthol, and benzylalcohol.

Examples of the glycol solvents include ethylene glycol, diethylene glycol, triethylene glycol, ethyleneglycol dimethyl ether, ethyleneglycol mono-butylether, ethyleneglycol mono-t-butylether, propylene glycol, isoprene glycol, dipropylene glycol, tripropylene glycol, 1,3-butanediol, 1,4-butanediol, neopentyl glycol, 1,5-pentanediol, 1,6-hexanediol, 2-methyl-2,4-pentanediol, and 3-methyl-1,5-pentanediol.

Examples of the ester solvents include aliphatic ester solvents and aromatic ester solvents. The aliphatic ester solvents are exemplified with methyl formate, ethyl formate, n-butyl formate, n-propyl formate, methyl acetate, ethyl acetate, allyl acetate, isopropyl acetate, n-butyl acetate, n-propyl acetate, diethyl succinate, dimethyl succinate, dimethyl carbonate, propylene carbonate, diethyl oxalate, dimethyl oxalate, methyl lactate, ethyl lactate, butyl lactate, methyl pyruvate, ethyl pyruvate, dimethyl malonate, diethyl malonate, and γ-butyrolactone. The aromatic ester solvents are exemplified with diallyl isophthalate, dimethyl isophthalate, diethyl isophthalate, dimethyl terephthalate, diethyl terephthalate, methyl benzoate, ethyl benzoate, n-propyl benzoate, and n-butyl benzoate.

Examples of the aldehyde solvents include aliphatic aldehyde solvents and aromatic aldehyde solvents. The aliphatic aldehyde solvents are exemplified with acetaldehyde, propione aldehyde, and furfural. The aromatic aldehyde solvents are exemplified with benzaldehyde.

Examples of the ketone solvents include aliphatic ketone solvents and aromatic ketone solvents. The aliphatic ketone solvents are exemplified with acetone, methylethyl ketone, methylisopropyl ketone, methyisobutyl ketone, diisopropyl ketone, diisobutyl ketone, cyclopentanone, cyclohexanone, 2-(1-cyclohexenyl)cyclohexanone, methylcyclohexanone, and 4-hydroxy-2-butanone. The aromatic ketone solvents are exemplified with propiophenone and benzophenone.

Examples of the carboxyl solvents include aliphatic carboxyl solvents and aromatic carboxyl solvents. The aliphatic carboxyl solvents are exemplified with formic acid, oxalic acid, propionic acid, and dodecanedioic acid. The aromatic carboxyl solvents are exemplified with benzoic acid, isophthalic acid, o-toluic acid, m-toluic acid, p-toluic acid, a-naphthoic acid, β-naphthoic acid, phenylacetic acid, and phenoxyacetic acid.

Examples of the acetate solvents include aliphatic acetate solvents and aromatic acetate solvents. The aliphatic acetate solvents are exemplified with propyleneglycolmonomethylether acetate, 3-methoxybutyl acetate, and 3-methoxy-3-methylbutyl acetate.

Examples of the ether solvents include aliphatic ether solvents and aromatic ether solvents. The aliphatic ether solvents are exemplified with methyl-t-butyl ether, diethyl ether, propyl ether, isopropyl ether, dibutyl ether, diisoamyl ether, 2,2-dimethoxy propane, propyleneglycolmonomethyl ether, dioxane, 1,3-dioxolane, cyclohexeneoxide, 2,3-dihydropyrane, tetrahydrofuran, and tetrahydropyrane. The aliphatic ether solvents are exemplified with anisole, ethoxyphenol, o-dimethoxybenzene, p-dimethoxybenzene, and benzyl ether.

Examples of the nitrogen containing solvents include aliphatic nitrogen containing solvents and aromatic nitrogen containing solvents. The aliphatic nitrogen containing solvents are exemplified with acetonitrile, amyl acetate, acetic acid amide, N,N-diisopropylethyl amine, cyclohexylamine, N,N-dimethylacetamide, N,N-dimethylformamide, and imidazole. The aromatic nitrogen containing solvents are exemplified with o-anisidine, p-anisidine, m-anisidine, aniline, p-aminoacetanilide, o-aminophenol, m-aminophenol, p-aminophenol, o-toluidine, m-toluidine, p-toluidine, N-methylaniline, N,N-dimethylaniline, N-ethylaniline, N,N-diethylaniline, diphenylamine, N,N-dimethyl-p-toluidine, pyridine, and quinoline.

Examples of the sulfur containing solvents include aliphatic sulfur containing solvents and aromatic sulfur containing solvents. The aliphatic sulfur containing solvents are exemplified with dimethyl sulfoxide and thiodiglycol. The aromatic sulfur containing solvents are exemplified with diphenylsulfide, diphenylsulfone, and benzylmercaptan.

The solvent is preferably aliphatic hydrocarbon solvents, aromatic hydrocarbon solvents, alcohol solvents, ether solvents, ester solvents, and ketone solvents; and more preferably aliphatic hydrocarbon solvents, aromatic hydrocarbon solvents, aromatic ether solvents, and aromatic ester solvents.

The solution composition of the invention is characterized by dissolving a polymer in one or more kind(s) of solvent(s); and preferably dissolved in 2 or more kinds of solvents. The kind of solvents is not particularly limited; preferably including one or more kind(s) of solvent(s) which has favorable solubility for a polymer and other one or more kind(s) of solvent(s) which rapidly increases the viscosity during drying the solvent for securing the uniformity of a film. Furthermore, regarding easiness of preparing a solution composition, 2 to 5 kinds of solvents are preferably used, and more preferably 2 to 3 kinds.

When the solution composition of the invention contains 2 or more kinds of solvents, the mixture of the solvents may include a solvent being solid at 25° C., but the mixture itself must be liquid at 25° C.

When the solution composition of the invention applies 2 or more kinds of solvents, in view of uniformity of a film to be formed, at least one kind of the solvents preferably has a boiling point of 180° C. or more, more preferably 180 to 250° C., and even more preferably 200 to 250° C.

Among the above solvents, in view of solubility and film-forming property, the followings are preferable: combination of one kind of aliphatic hydrocarbon solvent and one kind of aromatic hydrocarbon solvent; combination of one kind of aliphatic hydrocarbon solvent and one kind of aromatic ether solvent; combination of one kind of aliphatic hydrocarbon solvent and one kind of aromatic ester solvent; combination of two kinds of aromatic hydrocarbon solvents; combination of two kinds of aliphatic hydrocarbon solvents and one kind of aromatic hydrocarbon solvent; combination of one kind of aliphatic hydrocarbon solvent and two kinds of aromatic hydrocarbon solvents; combination of one kind of aliphatic hydrocarbon solvent and one kind of aromatic ether solvent; combination of two kinds of aliphatic hydrocarbon solvents and one kind of aromatic ether solvent; combination of one kind of aliphatic hydrocarbon solvent, one kind of aromatic hydrocarbon solvent, and one kind of aromatic ether solvent; and combination of one kind of aliphatic hydrocarbon solvent, one kind of aromatic hydrocarbon solvent, and one kind of aromatic ester solvent; and more preferably combination of one kind of aliphatic hydrocarbon solvent and one kind of aromatic hydrocarbon solvent; combination of one kind of aliphatic hydrocarbon solvent and one kind of aromatic ether solvent; and combination of one kind of aliphatic hydrocarbon solvent and one kind of aromatic ester solvent.

When combination of two kinds or more solvents are used, in order to reduce a flowability of a film while drying the solvents, a content of the solvent having the highest solubility to a polymer is preferably 10% by weight or more and 50% by weight or less with respect to the total amount of the solvents, and more preferably 10% by weight or more and 30% by weight or less. For example, when a solution composition is prepared from an aromatic polymer, anisole, and bicyclohexyl, the weight of anisole is preferably 50% by weight or less with respect to the total weight of anisole and bicyclohexyl, and more preferably 30% by weight or less.

As viscometers, capillary viscometers, rotating viscometers, and falling-ball viscometers are known; for determining a viscosity in the invention, a cone-plate type rotating viscometer is employed because it can easily determine a viscosity of a solution composition with small amount. Specifically, the measurement is conducted with using LVDV-II+ Pro manufactured by BROOKFIELD.

The concentration of the polymer contained in the solution composition of the invention is preferably 0.5 to 2.0% by weight, and more preferably 0.7 to 1.2% by weight. If the concentration is too low, this tends to require plurally coating the solution composition to obtain an intended film thickness; on the other hand, if being too high, this tends to cause a thicker film.

A film formed with using the solution composition of the invention can have a high toughness. Various ways are possible to determine the toughness; as a simple way, toughness can be determined by comparing the time that a film formed on a substrate is exposed with an ultrasonic wave until removing from the substrate.

Regarding the storage stability of the solution composition of the invention, it is preferable that the viscosity change at 30 days passing after preparing the solution composition is within ±5% with respect to the viscosity thereof at the time of the preparation, and more preferable that the viscosity change at 90 days passing after preparing the solution composition is within ±5% with respect to the viscosity thereof at the time of the preparation.

A thin film formed with using the solution composition of the invention can be applied to various applications. Methods for forming a thin film can employ coating methods such as spin coat methods, casting methods, micro gravure coat methods, gravure coat methods, bar coat methods, roll coat methods, wire-bar coat methods, dip coat methods, spray coat methods, screen printing methods, flexographic printing methods, offset print methods, and inkjet methods.

An optimal film thickness of the thin film varies depending on the materials used or intended uses thereof; for example, being 1 nm to 1 µm, preferably 2 nm to 500 nm, and more preferably 5 nm to 200 nm.

Applications of the thin film include polymer LEDs, organic transistors, organic solar cells, conductive thin films, secondary batteries, coloring matters for lasers, electrophotography photoconductors, photosensitive films, organic capacitors, color filters, organic superconductors, electromagnetic wave shields, and polymer piezo-electric substances.

The polymer LED of the invention is characterized by having a light-emitting layer between electrodes composed of a anode and a cathode, wherein the light-emitting layer is formed with using the solution composition of the invention. The polymer LED of the invention also includes a polymer light-emitting device having a layer including a conductive polymer which is disposed between at least one electrode and the light-emitting layer, and being adjacent to the electrode; and a polymer light-emitting device having an insulating layer having average film thickness of not more than 2 nm which is disposed between at least one electrode and the light-emitting layer, and being adjacent to the electrode.

Furthermore, the polymer LED of the invention includes a polymer LED having an electron transporting layer between the cathode and light-emitting layer, a polymer LED having a hole transporting layer between the anode and light-emitting layer, a polymer LED having an electron transporting layer between the cathode and light-emitting layer as well as a hole transporting layer between the anode and light-emitting layer, and the like.

As the structures of the polymer LED of the invention, the following structures of a) to d) are specifically exemplified:
a) anode/light-emitting layer/cathode,
b) anode/hole transporting layer/light-emitting layer/cathode,
c) anode/light-emitting layer/electron transporting layer/cathode, and
d) anode/hole transporting layer/light-emitting layer/electron transporting layer/cathode
(wherein the mark "/" denotes that respective layers are layered adjacent each other; hereinafter, denoting the same).

Herein, the light-emitting layer represents a layer having a function of emitting light, the hole transporting layer represents a layer having a function of transporting a hole, and the electron transporting layer represents a layer having a function of transporting an electron. For convenience, the electron transporting layer and hole transporting layer are collectively dubbed as a charge transporting layer. The light-emitting layer, hole transporting layer, and electron transporting layer may each independently apply 2 or more layers thereof.

Of a charge transporting layer disposed adjacent to an electrode, the one having a function of improving an efficiency of injecting charge from the electrode and an effect of lowering a voltage driving of a device is particularly dubbed as a charge injection layer (hole injection layer, electron injection layer).

Furthermore, in order to enhance adhesibility with an electrode and improve charge injection from an electrode, the charge injection layer mentioned above or an insulating layer having a film thickness of 2 nm or less may be disposed adjacent to the electrode; and in order to enhance adhesibility of an interface and prevent a mixing, a thin insulating layer may be inserted in the interface of the charge injection layer or light-emitting layer. The order and number of the layers to be layered, and the thickness of the respective layers may be appropriately set with considering a light-emitting efficiency and device life.

In the invention, the polymer LED having a charge injection layer (electron injection layer, hole injection layer) includes a polymer LED having a charge injection layer adjacent to the cathode, and a polymer LED having a charge injection layer adjacent to the anode. For example, the following structures of e) top) are included specifically:
e) anode/charge injection layer/light-emitting layer/cathode,
f) anode/light-emitting layer/charge injection layer/cathode,
g) anode/charge injection layer/light-emitting layer/charge injection layer/cathode,
h) anode/charge injection layer/hole transporting layer/light-emitting layer/cathode,
i) anode/hole transporting layer/light-emitting layer/charge injection layer/cathode,
j) anode/charge injection layer/hole transporting layer/light-emitting layer/charge injection layer/cathode,
k) anode/charge injection layer/light-emitting layer/electron transporting layer/cathode,
l) anode/light-emitting layer/electron transporting layer/charge injection layer/cathode,
m) anode/charge injection layer/light-emitting layer/electron transporting layer/charge injection layer/cathode,
n) anode/charge injection layer/hole transporting layer/light-emitting layer/electron transporting layer/cathode,
o) anode/hole transporting layer/light-emitting layer/electron transporting layer/charge injection layer/cathode, and
p) anode/charge injection layer/hole transporting layer/light-emitting layer/electron transporting layer/charge injection layer/cathode.

Specific examples of the charge injection layer include a layer having a conductive polymer; a layer disposed between the anode and hole transporting layer, having a material of which ionization potential value belongs between that of a anode material and that of a hole transporting material contained in the hole transporting layer; and a layer disposed between the cathode and electron transporting layer, having a material of which electronic affinity belongs between that of a cathode material and that of an electron transporting material contained in the electron transporting layer.

When the charge injection layer mentioned above is a layer containing a conductive polymer, the electric conductivity of the conductive polymer is preferably $10^{-5}$ S/cm or more and $10^3$ or less; and, in order to reduce a leakage current between light-emitting pixels, preferably $10^{-5}$ S/cm or more and $10^2$ or less, and more preferably $10^{-5}$ S/cm or more and $10^1$ or less.

When the charge injection layer mentioned above is a layer containing a conductive polymer, the electric conductivity of the conductive polymer is preferably $10^{-5}$ S/cm or more and $10^3$ S/cm or less; and, in order to reduce a leakage current between light-emitting pixels, preferably $10^{-5}$ S/cm or more and $10^2$ S/cm or less, and more preferably $10^{-5}$ S/cm or more and $10^1$ S/cm or less. The conductive polymer is usually doped with an appropriate amount of ion to render the electric conductivity of the conductive polymer $10^{-5}$ S/cm or more and $10^3$ or less.

A kind of ion to be doped is anion for the hole injection layer, or cation for the electron injection layer. The anion is exemplified with polystyrenesulfonate ion, alkylbenzenesulfonic acid ion, and camphor sulfonic acid ion; and the cation is exemplified with lithium ion, sodium ion, potassium ion, and tetrabutylammonium ion. A film thickness of the charge injection layer, for example, is 1 nm to 100 nm, and preferably 2 nm to 50 nm.

The material used for the charge injection layer may be appropriately selected with considering materials applied to the electrode or an adjacent layer, and examples thereof include polyaniline and its derivatives, polythiophene and its derivatives, polypyrrole and its derivatives, polyphenylenevinylene and its derivatives, polythienylenevinylene and its derivatives, polyquinoline and its derivatives, polyquinoxaline and its derivatives, conductive polymers such as polymers having an aromatic amine structure in their main chain or side chain, metal phthalocyanine (copper phthalocyanine etc.), and carbon.

The insulating layer having a film thickness of 2 nm or less has a function to make charge injection easy. A material for the insulating layer mentioned above includes metal fluorides, metal oxides, and organic insulating materials. The polymer LED having the insulating layer with a film thickness of 2 nm or less includes a polymer LED disposing the insulating layer with a film thickness of 2 nm or less adjacent to the cathode, and a polymer LED disposing the insulating layer with a film thickness of 2 nm or less adjacent to the anode.

Specifically the following structures of q) to ab) are exemplified:
q) anode/insulating layer with a film thickness of 2 nm or less/light-emitting layer/cathode,
r) anode/light-emitting layer/insulating layer with a film thickness of 2 nm or less/cathode,
s) anode/insulating layer with a film thickness of 2 nm or less/light-emitting layer/insulating layer with a film thickness of 2 nm or less/cathode,
t) anode/insulating layer with a film thickness of 2 nm or less/hole transporting layer/light-emitting layer/cathode,
u) anode/hole transporting layer/light-emitting layer/insulating layer with a film thickness of 2 nm or less/cathode,
v) anode/insulating layer with a film thickness of 2 nm or less/hole transporting layer/light-emitting layer/insulating layer with a film thickness of 2 nm or less/cathode,
w) anode/insulating layer with a film thickness of 2 nm or less/light-emitting layer/electron transporting layer/cathode,
x) anode/light-emitting layer/electron transporting layer/insulating layer with a film thickness of 2 nm or less/cathode,
y) anode/insulating layer with a film thickness of 2 nm or less/light-emitting layer/electron transporting layer/insulating layer with a film thickness of 2 nm or less/cathode, z) anode/insulating layer with a film thickness of 2 nm or less/hole transporting layer/light-emitting layer/electron transporting layer/cathode, aa) anode/hole transporting layer/light-emitting layer/electron transporting layer/insulating layer with a film thickness of 2 nm or less/cathode, and ab) anode/insulating layer with a film thickness of 2 nm or less/hole transporting layer/light-emitting layer/electron transporting layer/insulating layer with a film thickness of 2 nm or less/cathode.

Methods for forming a film of a light-emitting layer applying the solution composition of the invention can employ coating methods including spin coat methods, casting methods, micro gravure coat methods, gravure coat methods, bar coat methods, roll coat methods, wire-bar coat methods, dip coat methods, spray coat methods, screen printing methods, flexographic printing methods, offset print methods, and inkjet methods. Among of them, inkjet methods are preferably used.

The inkjet method is a method of spitting out a polymer solution with an inkjet device and the like after the polymer solution is prepared by dissolving a polymer in a solvent. An additive and dopant may be contained in the polymer solution in its preparation. This method is advantageous for selective coloring and for effectively utilizing a material with minimizing the loss thereof.

However, coating with the inkjet method may cause a problems: if a polymer concentration of the solution composition is too high, a thickness of the thin film obtained by coating becomes thick; and if a polymer concentration of the solution composition is too low, this requires plurally coating to obtain an intended film thickness, and resulting in increase of production cost. To avoid these problems, the polymer concentration of the solution composition is preferably contained in the range of 0.5 to 1.5% by weight, and more preferably 0.7 to 1.2% by weight.

An optimal film thickness of the light-emitting layer varies depending on the materials applied and may be set at the thickness of making values of a driving voltage and light emission efficiency reasonable, for example, being 1 nm to 1 μm, preferably 2 nm to 500 nm, and more preferably 5 nm to 200 nm.

When the polymer LED of the invention has a hole transporting layer, the hole transporting material to be used is exemplified with polyvinyl carbazole or its derivatives, polysilane or its derivatives, polysiloxane derivatives having aromatic amine in a side chain or main chain thereof, pyrazoline derivatives, arylamine derivatives, stilbene derivatives, triphenyldiamine derivatives, polyaniline or its derivatives, polythiophene or its derivatives, polypyrrole or its derivatives, poly(p-phenylenevinylene) or its derivatives, and poly(2,5-thienylenevinylene) or its derivatives.

The hole transporting material is specifically exemplified with those disclosed in Kokai S63-70257, S63-175860, H2-135359, H2-135361, H2-209988, H3-37992, and H3-152184.

Among them, the hole transporting material used for the hole transporting layer preferably includes high molecular weight hole transporting materials such as polyvinyl carbazole or its derivatives, polysilane or its derivatives, polysiloxane derivatives having an aromatic amine compound group in a side chain or main chain thereof, polyaniline or its derivatives, polythiophene or its derivatives, poly(p-phenylenevinylene) or its derivatives, and poly(2,5-thienylenevinylene) or its derivatives; and more preferably polyvinyl carbazole or its derivatives, polysilane or its derivatives, and polysiloxane derivatives having an aromatic amine in a side chain or main chain thereof. When the hole transporting material is a low molecular weight, it is preferably used in a form dispersed in a polymer binder.

The polyvinyl carbazole or its derivatives, for example, are produced with cation or radical polymerization of a vinyl monomer.

The polysilane or its derivatives are exemplified with compounds disclosed in Chem. Rev. Vol. 89, page 1359 (1989) and the published specification of British Patent GB2300196; and may be synthesized with methods disclosed therein, and particularly preferably with Kipping method.

Since the polysiloxane or its derivatives hardly have hole transportability in their siloxane skeleton structure, they are preferably used in the structure providing the above low molecular hole transporting material to their side chain or main chain; and particularly exemplified with the structure providing a hole transporting aromatic amine to their side chain or main chain.

A method for forming a film of the hole transporting layer is not particularly limited: as for the low molecular weight hole transporting material, the method of forming a film from a solution thereof being mixed with a polymer binder is exemplified; and as for the high molecular weight hole transporting material, the method of forming a film from a solution thereof is exemplified.

A solvent used for forming a film from the solution is not particularly limited as long as dissolving the hole transporting material. The solvent is exemplified with the solvent used for the solution composition of the invention.

The method for forming a film from a solution can use methods of coating the solution such as spin coat methods, casting methods, micro gravure coat methods, gravure coat methods, bar coat methods, roll coat methods, wire-bar coat methods, dip coat methods, spray coat methods, screen printing methods, flexographic printing methods, offset print methods, and inkjet methods.

The polymer binder to be mixed is preferably the one not significantly inhibiting charge transportation, and furthermore the one not strongly absorbing visible light for being suitably applied. The polymer binder is exemplified with polycarbonates, polyacrylates, polymethylacrylates, polymethylmethacrylates, polystyrenes, polyvinyl chlorides, and polysiloxanes.

An optimal film thickness of the hole transporting layer varies depending on the materials used and may be set at the thickness of making values of a driving voltage and emission efficiency reasonable; the thickness not causing a pinhole is at least required, while too thick film is unfavorable because of raising the driving voltage of a device. Therefore, the film thickness of the hole transporting layer, for example, is 1 nm to 1 μm, preferably 2 nm to 500 nm, and more preferably 5 nm to 200 nm.

When the polymer LED of the invention has the electron transporting layer, known electron transporting materials can be used, and examples thereof include oxadiazole derivatives, anthraquinodimethane or its derivatives, benzoquinone or its derivatives, naphthoquinone or its derivatives, anthraquinone or its derivatives, tetracyanoanthraquinonedimethane or its derivatives, fluorenone derivatives, diphenyldicyanoethylene or its derivatives, diphenoquinone derivatives, 8-hydroxyquinoline or its derivatives' metal complexes, polyquinoline or its derivatives, polyquinoxaline or its derivatives, and polyfluorene or its derivatives.

Specifically exemplified are those disclosed in Kokai S63-70257, S63-175860, H2-135359, H2-135361, H2-209988, H3-37992, H3-152184.

Among them, preferable are oxadiazole derivatives, benzoquinone or its derivatives, anthraquinone or its derivatives, 8-hydroxyquinoline or its derivatives' metal complexes, polyquinoline or its derivatives, polyquinoxaline or its derivatives, and polyfluorene or its derivatives; and more preferable being 2-(4-biphenylyl)-5-(4-t-butylphenyl)-1,3,4-oxadiazole, benzoquinone, anthraquinone, tris(8-quinolinol)aluminium, and polyquinoline.

A method for forming a film of the electron transporting layer is not particularly limited; as for a low molecular electron transporting material, vacuum deposition methods from a powder and film forming methods from a solution or molten state are exemplified; and as for a high molecular electron transporting material, film forming methods from a solution or molten state are exemplified. For forming a film from a solution or molten state, a polymer binder may be used together.

A solvent used for forming a film from a solution is not particularly limited as long as dissolving an electron transporting material and/or polymer binder. The solvent is exemplified with chlorine solvents such as chloroform, methylene chloride, and dichloroethane; ether solvents such as tetrahydrofuran; aromatic hydrocarbon solvents such as toluene and xylene; ketone solvents such as acetone and methylethylketone; and ester solvents such as ethyl acetate, butyl acetate, and ethylcellosolve acetate.

The methods for forming a film from a solution or molten state can use coating methods including spin coat methods, casting methods, micro gravure coat methods, gravure coat methods, bar coat methods, roll coat methods, wire-bar coat methods, dip coat methods, spray coat methods, screen printing methods, flexographic printing methods, offset print methods, and inkjet methods.

As the polymer binder to be mixed, preferable is the one not significantly inhibiting charge transportation, and furthermore the one not strongly absorbing visible light for being suitably applied. The polymer binder is exemplified with poly(N-vinylcarbazole), polyaniline or its derivatives, polythiophene or its derivatives, poly(p-phenylenevinylene) or its derivatives, poly(2,5-thienylenevinylene) or its derivatives, polycarbonates, polyacrylates, polymethylacrylates, polymethylmethacrylates, polystyrenes, polyvinyl chlorides, or polysiloxanes.

An optimal film thickness of the electron transporting layer varies depending on the materials applied and may be set at the thickness of making values of a driving voltage and emission efficiency reasonable; the thickness not causing a pinhole is at least required, while too thick film is unfavorable because of raising the driving voltage of a device. Therefore, the film thickness of the electron transporting layer, for example, is 1 nm to 1 μm, preferably 2 nm to 500 nm, and more preferably 5 nm to 200 nm.

A substrate composing the polymer LED of the invention may be the one capable of forming an electrode and not being changed in forming an organic film; for example, including glass, plastic, polymer film, and silicone substrates. When the substrate is opaque, the opposite electrode is preferably transparent or translucent.

At least one of electrodes including an anode and cathode is typically transparent or translucent, and the electrode disposed at the anode is preferably transparent or translucent. For a material of the anode, conductive metal oxide films, translucent metal thin films, and the like are used: specifically including oxides such as indium oxide, zinc oxide, tin oxide, and indium-tin-oxide (ITO) as a complex of such oxides; films (NESA etc.) produced using an electrically conductive glass which consists of indium-zinc-oxide, and the like; and gold, platinum, silver, copper, and the like; preferably ITO, indium-zinc-oxide, and tin oxide. A method for producing the electrode includes vacuum deposition methods, sputtering methods, ion plating methods, plating methods, and the like. Moreover, the anode may use organic transparent electric conductive films such as polyaniline or its derivatives, polythiophene or its derivative, and the like. A film thickness of the anode may be appropriately selected under consideration of optical transparency and electric conductivity, for example being 10 nm to 10 μm, preferably 20 nm to 1 μm, and more preferably 50 nm to 500 nm. Furthermore, on the anode, to make charge injection easy, a layer may be disposed, the layer being composed of a phthalocyanine derivative, a conductive polymer, carbon, or the like, or being composed of a metal oxide, metal fluoride, an organic insulating material, or the like and having an average film thickness of 2 nm or less.

A material used for the cathode of the polymer LED of the invention is preferably the material having small work function. For example, used are metals such as lithium, sodium, potassium, rubidium, caesium, beryllium, magnesium, calcium, strontium, barium, aluminium, scandium, vanadium, zinc, yttrium, indium, cerium, samarium, europium, terbium, and ytterbium, and alloys composed of 2 or more thereof; alloys composed of one or more metal(s) or alloy(s) selected from the metal group described above and one or more metal(s) selected from the group consisting of gold, silver, platinum, copper, manganese, titanium, cobalt, nickel, tungsten, and tin; and graphite or intercalated graphites. Examples of the alloy includes magnesium-silver alloys, magnesium-indium alloys, magnesium-aluminium alloys, indium-silver alloys, lithium-aluminium alloys, lithium-magnesium alloys, lithium-indium alloys, calcium-aluminium alloys, and the like. The cathode may be a layered structure having 2 or more layers.

A film thickness of the cathode may be appropriately selected under consideration of electric conductivity and durability, for example being 10 nm to 10 μm, preferably 20 nm to 1 μm, and more preferably 50 nm to 500 nm.

A method for producing the cathode includes vacuum deposition methods, sputtering methods, laminating methods thermally bonding a metal thin film under a pressure, or the like. Furthermore, a layer may be disposed between the cathode and an organic substance layer, the layer being composed of a conductive polymer, or being composed of a metal oxide, metal fluoride, an organic insulating material, or the like and having an average film thickness of 2 nm or less; still furthermore, a protection layer may be disposed to protect the polymer LED after producing the cathode. To use the polymer LED stably for long period and protect a device from the outside, the protection layer and/or protection cover is preferably disposed.

The protection layer may use high molecular weight compounds, metal oxides, metal fluorides, metal borides, and the like. The protection cover may use glass plates, plastic plates of which surface is subjected to anti-water permeability treatment, and the like; and a method of adhering the cover with a device substrate with a thermally curable resin or light curable resin to seal is suitably employed. If a space on the device is maintained by applying a spacer, it is easy to prevent the device from being harmed. If an inert gas such as nitrogen and argon is sealed in the space, the cathode can be prevented from the oxidation; furthermore, if a desiccant agent such as barium oxide is disposed in the space, the device can be easily protected from damages to be caused with the water absorbed during the production processes. Any one or more means mentioned above is preferably applied.

The polymer light-emitting device of the invention can be used for flat light sources, segment displays, dot-matrix displays, backlights for liquid crystal displays, and the like.

A flat light emission with using the polymer LED of the invention can be obtained by disposing a flat anode on a flat cathode. Furthermore, a patterned light emission can be obtained with methods such that a mask having a patterned window is disposed on the surface of the flat light-emitting device mentioned above, that an organic substance layer of a part not emitting light is formed extremely thickly for making the part substantially non-light-emitting, or that any one or both of the cathode and cathode is patterned. Forming a pattern with any one of the above methods and arranging some electrodes which can be independently switched, this can provide a segment-type display which is able to display numerals, letters, and simple marks. Furthermore, for providing a dot-matrix device, the anode and cathode are formed in a striped shape respectively and arranged orthogonally each other. Selectively coating plural kinds of polymer phosphors emitting different colors, or using a color filter or fluorescence conversion filter, these methods enable partially colored displaying or multi-colored displaying. The dot-matrix device is applicable to the passive drive, or may be applied to the active drive under combination with TFT and the like. These display devices can be used for a display of computers, televisions, mobile terminals, cellular phones, car navigations, and a viewer finder of video cameras.

Furthermore, since the flat light-emitting device mentioned above has a thin shape and emits light by itself, it can be suitably used for a flat light source for a backlight of liquid crystal displays, or for a light source of flat-shaped lamps; and still furthermore, being used for curved light sources or displays by employing a flexible substrate.

With using the solution composition of the invention, coloring matters for lasers, materials for organic solar cells, organic semiconductors for organic transistors, and materials for electro conductive thin films can be produced.

Hereinafter, examples are illustrated to explain the invention in more detail, but the invention should not be construed to be limited thereto.

Z-average molecular weight, number-average molecular weight, and weight-average molecular weight are determined with a gel permeation chromatography (GPC) (manufactured by Shimadzu Corporation: LC-10Avp) as polystyrene-reduced Z-average molecular weight, number-average molecular weight, and weight-average molecular weight. A polymer to be measured was dissolved in tetrahydrofuran so as to become the concentration of about 0.5% by weight, and 50 µl of the polymer solution was injected into the GPC. The mobile phase of the GPC was tetrahydrofuran and flown by the flow velocity of 0.6 ml/min. A column was arranged by connecting two columns of TSKgel SuperHM-H (manufactured by TOSOH Co., Ltd.) and one column of TSKgel SuperH2000 (manufactured by TOSOH Co., Ltd.) in series. A differential refractive index detector (manufactured by Shimadzu Corporation: RID-10A) was used for a detector. The viscosity of a composite was measured by the above method.

SYNTHESIS EXAMPLE 1

Synthesis of Polymer 1

After putting 12.8 g of the below compound A and 5.5 g of 2,2'-bipyridyl in a reactor, the atmosphere of the reaction system was replaced with nitrogen gas. In the reaction system, 600 g of tetrahydrofuran (dehydration solvent) which was deaerated in advance by bubbling with argon gas, was added. Thereafter, in this mixed solution, 10 g of bis (1,5-cyclooctadiene)nickel(0) was added, stirred at a room temperature for 10 minutes, and then reacted at 60° C. for 3 hours. The reaction was conducted under the nitrogen gas atmosphere.

After the reaction, the resultant solution was cooled, poured into a mixture of 80 ml of 25% aqueous ammonia/400 ml of methanol/400 ml of ion-exchanged water, and then stirred for about 1 hour. Then, the resultant precipitate was collected by filtration. This precipitate was dried under a reduced pressure, and then dissolved in toluene. After filtrating this toluene solution to remove insoluble matter, the toluene solution was purified through a column packed with alumina. Thereafter, this toluene solution was washed with 1 N hydrochloric acid; and allowing stand still, and then subjected to partitioning separation to recover a toluene solution. Thereafter, this toluene solution was washed with about 3% aqueous ammonia; and allowing stand still, and then subjected to partitioning separation to recover a toluene solution. Thereafter, this toluene solution was washed with water; and allowing stand still, and then subjected to partitioning separation to recover a toluene solution. Thereafter, methanol was added to this toluene solution with stirring to re-precipitate for purification.

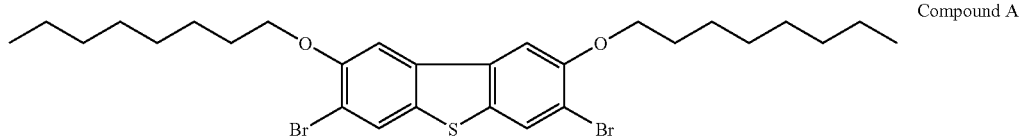

Compound A

Thereafter, the resultant precipitate was collected with filtration. This precipitate was dried under a reduced pressure to obtain 4.0 g of polymer. This polymer is referred to Polymer 1. Polymer 1 obtained had polystyrene-reduced Z-average molecular weight of $1.0 \times 10^6$, weight-average molecular weight of $4.5 \times 10^5$, and number-average molecular weight of $1.7 \times 10^5$.

PREPARATION EXAMPLE 1

Preparation of Composition 1

Composition 1 was prepared by dissolving 50 mg of Polymer 1 in a mixed solution of 1.50 g of xylene and 3.53 g of bicyclohexyl. The polymer concentration of Composition 1 is 0.98% by weight.

EXAMPLE 1

Viscosity Measurement of Composition 1

The viscosity of Composition 1 was measured as 22.2 mPa·s.

SYNTHESIS EXAMPLE 2

Synthesis of Polymer 2

After putting 0.60 g of the above compound A and 0.37 g of 2,2'-bipyridyl in a reactor, the atmosphere of the reaction system was replaced with nitrogen gas. In the reaction system, 40 g of N,N-dimethylformamide (dehydration solvent) which was deaerated in advance by bubbling with argon gas, was added. Thereafter, in this mixed solution, 0.66 g of bis(1,5-cyclooctadiene)nickel(0) was added, stirred at a room temperature for 10 minutes, and then reacted at 60° C. for 3 hours. The reaction was conducted under a nitrogen gas atmosphere. After finishing the reaction, the reaction solution was cooled, poured into a mixture of 10 ml of 25% aqueous ammonia/100 ml of methanol/200 ml of ion-exchanged water, and then stirred for about 1 hour. Thereafter, the resultant precipitate was collected by filtration. This precipitate was dried under a reduced pressure, and then dissolved in toluene. After filtrating this toluene solution to remove insoluble matters, the toluene solution was washed with 1 N hydrochloric acid; and allowing stand still, and then subjected to partitioning separation to recover the toluene solution. Thereafter, this toluene solution was washed with about 3% aqueous ammonia; and allowing stand still, and then subjected to partitioning separation to recover the toluene solution. Thereafter, this toluene solution was washed with water; and allowing stand still, and then subjected to partitioning separation to recover a toluene solution. Thereafter, methanol was added to this toluene solution with stirring to re-precipitate for purification.

Thereafter, the resultant precipitate was collected by filtration. This precipitate was dried under a reduced pressure to obtain 0.15 g of polymer. This polymer is referred to Polymer 2. Polymer 2 obtained had polystyrene-reduced Z-average molecular weight of $4.2 \times 10^4$, weight-average molecular weight of $2.2 \times 10^4$, and number-average molecular weight of $1.0 \times 10^4$.

PREPARATION EXAMPLE 2

Preparation of Composition 2

Composition 2 was prepared by dissolving 50 mg of Polymer 2 in a mixed solution of 1.51 g of xylene and 3.50 g of bicyclohexyl. The polymer concentration of Composition 2 was 0.99% by weight.

COMPARATIVE EXAMPLE 1

Viscosity Measurement of Composition 2

The viscosity of Composition 2 was measured as 2.6 mPa·s.

SYNTHESIS EXAMPLE 1

Synthesis of Polymer 3

After dissolving 0.48 g of the above compound A, 0.15 g of the below compound B, and 0.33 g of 2,2'-bipyridyl in 28 ml of dehydrated tetrahydrofuran, 0.58 g of bis(1,5-cyclooctadiene)nickel(0) was added to this solution under a nitrogen atmosphere, heated up to 60° C., and then reacted for 3 hours. After the reaction, the reaction solution was cooled to a room temperature, dropped into a mixture of 14 ml of 25% aqueous ammonia/170 ml of methanol/70 ml of ion-exchanged water, and then stirred for about 30 minutes; thereafter, the resultant precipitate was collected by filtration, dried under a reduced pressure for 2 hours, and then dissolved in 40 ml of toluene. 40 ml of 1 N hydrochloric acid was added to this toluene solution, stirred for 3 hours, and then subjected to fractionation to remove the water layer. Thereafter, the organic layer was added with 40 ml of 4% aqueous ammonia, stirred for 3 hours, and then subjected to fractionation to remove the water layer. Thereafter, the organic layer was dropped into 210 ml of methanol, stirred for 30 minutes, and then the resultant precipitate was collected by filtration, dried for 2 hours under a reduced pressure to dissolve in 40 ml of toluene. Thereafter, this toluene solution was purified through a column packed with alumina (14 g of alumina), and then the recovered toluene solution was dropped into 280 ml of methanol, stirred for 30 minutes, and then the resultant precipitate was collected by filtration to dry for 2 hours under a reduced pressure. The amount of the polymer obtained was 0.31 g. This polymer is referred to Polymer 3. Polymer 3 obtained had polystyrene-reduced Z-average molecular weight of $1.0 \times 10^6$, weight-average molecular weight of $3.7 \times 10^5$, and number-average molecular weight of $7.6 \times 10^4$.

Compound B

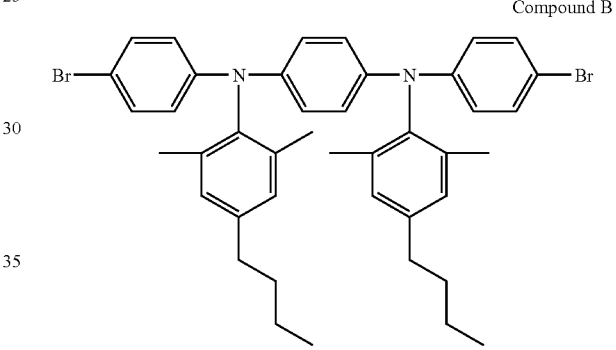

PREPARATION EXAMPLE 3

Preparation of Composition 3

Composition 3 was prepared by dissolving 51 mg of Polymer 3 in a mixed solution of 1.51 g of xylene and 3.55 g of bicyclohexyl. The polymer concentration of Composition 3 is 1.0% by weight.

EXAMPLE 2

Viscosity Measurement of Composition 3

The viscosity of Composition 3 was measured as 6.2 mPa·s.

SYNTHESIS EXAMPLE 4

Synthesis of Polymer 4

After dissolving 0.48 g of the above compound A, 0.15 g of the above compound B, and 0.27 g of 2,2'-bipyridyl in ml of dehydrated tetrahydrofuran, 0.47 g of bis(1,5-cyclooctadiene)nickel(0) was added to this solution under a nitrogen atmosphere, heated up to 60° C., and then reacted for 3 hours. After the reaction, the reaction solution was cooled to a room temperature, dropped into a mixture of 14 ml of 25% aqueous ammonia/170 ml of methanol/70 ml of ion-exchanged water, and then stirred for 30 minutes; thereafter, the resultant precipitate was collected by filtration, dried for 2 hours under a reduced pressure. The amount of the polymer obtained was 0.5 g. This polymer is referred to Polymer 4. Polymer 4 obtained had polystyrene-reduced Z-average molecular weight of $3.9 \times 10^4$, weight-average molecular weight of $2.5 \times 10^4$, and number-average molecular weight of $1.3 \times 10^4$.

PREPARATION EXAMPLE 4

Preparation of Composition 4

Composition 4 was prepared by dissolving 51 mg of Polymer 4 in a mixed solution of 1.51 g of xylene and 3.50 g of bicyclohexyl. The polymer concentration of Composition 4 is 1.0% by weight.

COMPARATIVE EXAMPLE 2

Viscosity Measurement of Composition 4

The viscosity of Composition 4 was measured as 2.3 mPa·s.

SYNTHESIS EXAMPLE 5

Synthesis of Compound C

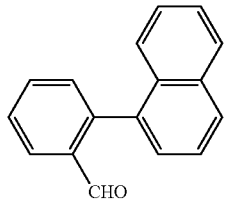

Compound C

After putting 5.00 g (29 mmol) of 1-naphthaleneboronic acid, 6.46 g (35 mmol) of 2-bromobenzaldehyde, 10.0 g (73 mmol) of potassium carbonate, 36 ml of toluene, and 36 ml of ion-exchanged water in a 300 ml three-neck flask under an inert atmosphere, this mixture was bubbled with argon gas for 20 minutes at a room temperature with stirring. Then, 16.8 mg (0.15 mmol) of tetrakis(triphenylphosphine)palladium was added to the mixture, and then further bubbled with argon gas for 10 minutes at a room temperature with stirring; thereafter, heated up to 100° C., and then reacted for 25 hours. After being cooled to a room temperature, an organic layer was extracted with toluene, dried with sodium sulfate, and then distilled the solvent off. After being purified through a silica gel column with a mixed solution consisting of toluene:cyclohexane=1:2 as an eluent, 5.18 g (yield 86%) of Compound C was obtained as a white crystal.

$^1$H-NMR (300 MHz/CDCl$_3$):

δ 7.39~7.62 (m, 5H), 7.70 (m, 2H), 7.94 (d, 2H), 8.12 (d d, 2H), 9.63 (s, 1H)

MS (APCI (+)): (M+H)$^+$ 233

SYNTHESIS EXAMPLE 6

Synthesis of Compound D

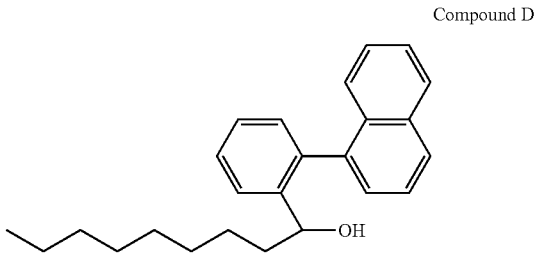

Compound D

After putting 8.00 g (34.4 mmol) of compound C and 46 ml of dehydrated THF in a 300 ml three-neck flask under an inert atmosphere, this mixture was cooled to −78° C. Then, to the mixture, 52 ml of n-octylmagnesium bromide (1.0 mol/l THF solution) was dropped over 30 minutes. After the dropping, the resultant mixture was heated up to 0° C., stirred for 1 hour, further heated up to a room temperature, and then stirred for 45 minutes. Under placing the flask in an ice bath, the reaction was terminated with addition of 20 ml of 1N hydrochloric acid, and then an organic layer was extracted with ethyl acetate, and dried with sodium sulfate. After distilling off the solvent, by purifying through a silica gel column with a mixed solution consisting of toluene:hexane=10:1 as an eluent, 7.64 g (yield 64%) of Compound D was obtained as a light yellow oil. Although two peaks were observed in a HPLC measurement, since they had the same mass number in a LC-MS measurement, they were judged as a mixture of isomers.

SYNTHESIS EXAMPLE 7

Synthesis of Compound E

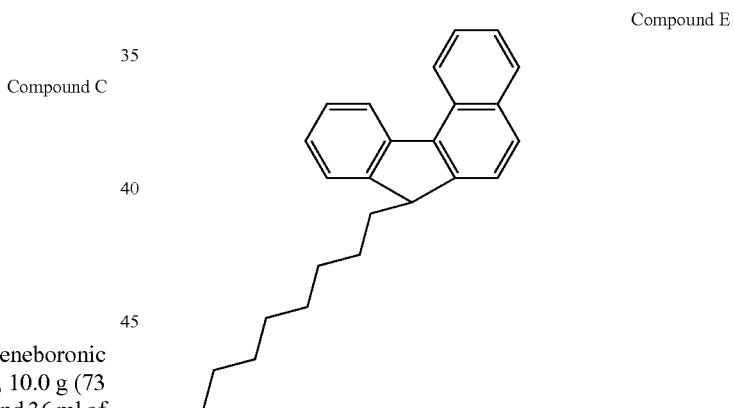

Compound E

After putting 5.00 g (14.4 mmol) of compound D (the mixture of isomers) and 74 ml of dehydrated dichloromethane, in a 500 ml three-neck flask under an inert atmosphere, this mixture was stirred at a room temperature to dissolve. Then, boron trifluoride etherate complex was dropped to the mixture at a room temperature over 1 hour, and then, after finishing the dropping, stirred at a room temperature for 4 hours. 125 ml of ethanol was slowly added to the resultant mixture with stirring, and then, after the heat generation was finished, the organic layer was extracted with chloroform, washed twice with water, and then dried with magnesium sulfate. By purifying through a silica gel column with hexane as an eluent, 3.22 g (yield 68%) of Compound E was obtained as a colorless oil.

$^1$H-NMR (300 MHz/CDCl$_3$):

δ 0.90 (t, 3H), 1.03~1.26 (m, 14H), 2.13 (m, 2H), 4.05 (t, 1H), 7.35 (dd, 1H), 7.46~7.50 (m, 2H) 7.59~7.65 (m, 3H), 7.82 (d, 1H), 7.94 (d, 1H), 8.35 (d, 1H), 8.75 (d, 1 H)

MS (APCI (+)): (M+H)$^+$ 329

SYNTHESIS EXAMPLE 8

Synthesis of Compound F

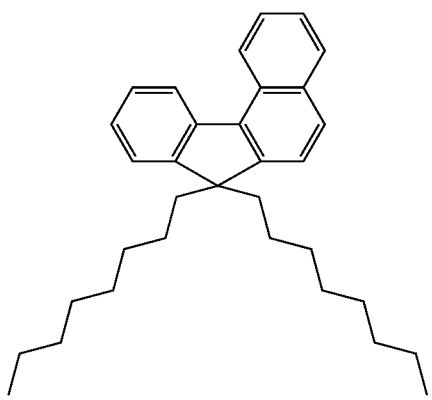

Compound F

After putting 20 ml of ion-exchanged water in a 200 ml three-neck flask under an inert atmosphere, 18.9 g (0.47 mol) of sodium hydroxide was added little by little to dissolve with stirring. After the aqueous solution was cooled to a room temperature, 20 ml of toluene, 5.17 g (15.7 mmol) of Compound E, and 1.52 g (4.72 mmol) of tributylammonium bromide was added to the solution, and then heated up to 50° C.; thereafter, n-octyl bromide was dropped, and then, after finishing the dropping, reacted at 50° C. for 9 hours. After the reaction, the organic layer was extracted with toluene, washed twice with water, and then dried with sodium sulfate. After distilling the solvent off, by purifying through a silica gel column with hexane as an eluent, 5.13 g (yield 74%) of Compound F was obtained as a yellow oil.

$^1$H-NMR (300 MHz/CDCl$_3$):

δ 0.52 (m, 2H), 0.79 (t, 6H), 1.00~1.20 (m, 22H), 2.05 (t, 4H), 7.34 (d, 1H), 7.40~7.53 (m, 2H), 7.63 (m, 3H), 7.83 (d, 1H), 7.94 (d, 1H), 8.31 (d, 1H), 8.75 (d, 1H) MS (APCI (+)): (M+H)$^+$ 441

SYNTHESIS EXAMPLE 9

Synthesis of Compound G

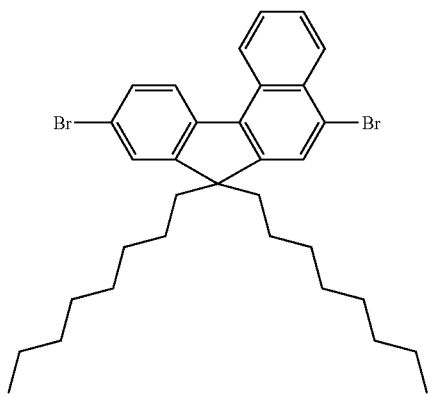

Compound G

After putting 4.00 g (9.08 mmol) of Compound F and 57 ml of the mixed solvent consisting of acetic acid:dichloromethane=1:1 in a 50 ml three-neck flask having a capacity of, under the air atmosphere, this mixture was stirred at a room temperature to dissolve. Thereafter, the resultant solution was added with 7.79 g (20.0 mmol) of benzyltrimethylammonium tribromide, and then, with stirring, zinc chloride was added until benzyltrimethylammonium tribromide was completely dissolved. After stirring for 20 hours at a room temperature, the reaction was terminated with addition of 10 ml of 5% aqueous sodium hydrogensulfite solution, and then the organic layer was extracted with chloroform, washed twice with aqueous potassium carbonate solution, and then dried with sodium sulfate. After purifying twice through a flush column with hexane as an eluent, by re-crystallizing with the mixed solvent consisting of ethanol:hexane=1:1, and then with that of 10:1, 4.13 g (yield 76%) of Compound G was obtained as a white crystal.

$^1$H-NMR (300 MHz/CDCl$_3$):

δ 0.60 (m, 2H), 0.91 (t, 6H), 1.01~1.38 (m, 22H), 2.09 (t, 4H), 7.62~7.75 (m, 3H), 7.89 (s, 1H), 8.20 (d, 1H), 8.47 (d, 1H), 8.72 (d, 1H)

MS (APPI (+)): (M+H)$^+$ 598

SYNTHESIS EXAMPLE 10

Synthesis of Polymer 5 and 6

After dissolving Compound G (1.98 g, 0.0033 mol) and 2,2'-bipyridyl (1.39 g, 0.0089 mol) in 356 ml of dehydrated tetrahydrofuran, this solution was bubbled with nitrogen to replace the atmosphere of the reaction system with nitrogen. Under the nitrogen atmosphere, this solution was heated up to 60° C., bis(1,5-cyclooctadiene)nickel(0) {nickel(COD)$_2$} (1.392 g, 0.0089 mol) was added, and then reacted for 3 hours. After the reaction, the reaction solution was cooled to a room temperature (about 25° C.), dropped into the mixed solution consisting of 12 ml of 25% aqueous ammonia/350 ml of methanol/350 ml of ion-exchanged water, stirred for 30 minutes, and then the resultant precipitate was collected by filtration and dried with air. Thereafter, the precipitate was dissolved in 100 ml of toluene, and then subjected to filtration; thereafter, the filtrate was purified through an alumina column, added with about 200 ml of 1N hydrochloric acid, stirred for 3 hours, and then the water layer was removed; thereafter, about 200 ml of 4% aqueous ammonia was added to the organic layer, and then stirred for 2 hours to remove the water layer. About 200 ml of ion-exchanged water was added to the organic layer, and stirred for 1 hour, the water layer was removed. About 50 ml of methanol was dropped to the organic layer, stirred for 1 hour, and then the supernatant liquid was separated by filtration. The precipitate obtained by these procedures is referred to I and the filtrate is referred to II.

Precipitate I obtained was dissolved in 100 ml of toluene, dropped in about 200 ml of methanol, stirred for 1 hour, filtrated, and then dried for 2 hours under a reduced pressure. The amount of the polymer obtained was 2.6 g (hereinafter, referred to Polymer 5). The polystyrene-reduced average molecular weight and the weight average molecular weight of Polymer 5 were Mn=7.4×10$^4$, Mw=1.8×10$^5$, and Mz=3.4×10$^5$ respectively.

Moreover, Filtrate II was condensed to 10 ml with an evaporator, dropped in about 50 ml of methanol, stirred for 1 hour, and then filtrated to dry for 2 hours under a reduced pressure. The amount of the polymer obtained was 0.08 g (hereinafter, referred to Polymer 6). The polystyrene-reduced average molecular weight and the weight average molecular weight of Polymer 6 were Mn=9.3×10$^3$, Mw=1.4×10$^4$, and Mz=2.3×10$^4$ respectively.

PREPARATION EXAMPLE 5

Preparation of Composition 5

Composition 5 was prepared by dissolving 51 mg of Polymer 5 in a mixed solution of 1.50 g of xylene and 3.51 g of bicyclohexyl. The polymer concentration of Composition 5 was 1.0% by weight.

EXAMPLE 3

Viscosity Measurement of Composition 5

The viscosity of Composition 5 was measured as 7.0 mPa·s.

PREPARATION EXAMPLE 6

Preparation of Composition 6

Composition 6 was prepared by dissolving 51 mg of Polymer 6 in a mixed solution of 1.52 g of xylene and 3.50 g of bicyclohexyl. The polymer concentration of Composition 6 is 1.0% by weight.

COMPARATIVE EXAMPLE 3

Viscosity Measurement of Composition 6

The viscosity of Composition 6 was measured as 2.0 mPa·s.

INDUSTRIAL APPLICABILITY

The solution composition of the invention can have a significantly high viscosity and a film having high uniformity can be easily obtained. The polymer light-emitting device including the film of high uniformity as a light-emitting layer can be used for flat light sources, segment displays, dot-matrix displays, back-lights for liquid crystal displays, and the like.

The invention claimed is:

1. A solution composition comprising one or more solvent(s) and one or more conjugated aromatic polymer(s) having a polystyrene-reduced Z-average molecular weight of $1.0 \times 10^5$ to $5.0 \times 10^6$, and having at least one repeating unit selected from the group consisting of formulas (5-1), (5-2), (5-3), (5-4) and an amount of a repeating unit other than the formulas (5-1), (5-2), (5-3), and (5-4) which is 30% by moles or less based on the sum of total repeating units:

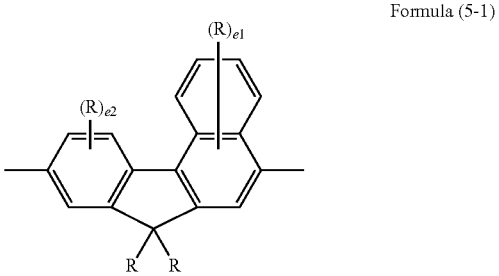

Formula (5-1)

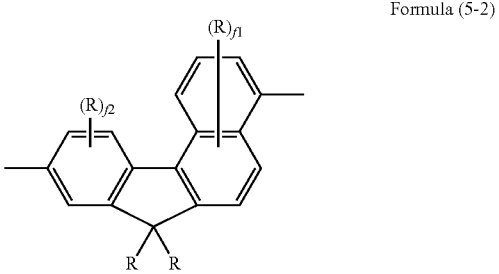

Formula (5-2)

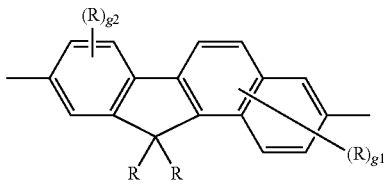

Formula (5-3)

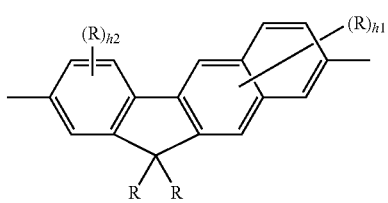

Formula (5-4)

where R represents an alkyl group, an alkoxy group, an alkylthio group, an alkylsilyl group, an alkyl amino group, a hydroxyl group, an amino group, a carboxyl group, an aldehyde group, a cyano group, an aryl group, an aryloxy group, an arylthio group, or an arylalkyl group; and where e1 represents an integer of 0 to 5, and e2 represents an integer of 0 to 3; f1 represents an integer of 0 to 5, and f2 represents an integer of 0 to 3; g1 represents an integer of 0 to 5, and g2 represents an integer of 0 to 3; h1 represents an integer of 0 to 5, and h2 represents an integer of 0 to 3.

2. The solution composition according to claim 1, wherein the polymer has a polystyrene-reduced number-average molecular weight of $5.0 \times 10^4$ to $3.0 \times 10^5$, polystyrene-reduced weight-average molecular weight of $1.0 \times 10^5$ to $1.0 \times 10^6$, and polystyrene-reduced Z-average molecular weight of $3.0 \times 10^5$ to $3.0 \times 10^6$.

3. The solution composition according to claim 1 or 2, wherein the polymer content is 0.5 to 1.5% by weight when the total weight of the solution composition is defined as 100% by weight.

4. The solution composition according to claim 1 or 2, comprising two or more kinds of solvents.

5. A thin film produced with using the solution composition according to claim 1 or 2.

6. A polymer light-emitting device having a thin film according to claim 5.

7. A polymer light-emitting device having a light-emitting layer between electrodes comprising an anode and a cathode, wherein the light-emitting layer is formed with using the solution composition according to claim 1.

8. The polymer light-emitting device according to claim 7, wherein the light-emitting layer is formed by inkjet method.

9. A flat light source comprising the polymer light-emitting device according to claim 7 or 8.

10. A segment display comprising the polymer light-emitting device according to claim 7 or 8.

11. A dot-matrix display comprising the polymer light-emitting device according to claim 7 or 8.

12. A liquid crystal display comprising the polymer light-emitting device according to claim 7 or 8, as a backlight.

13. The solution composition according to claim 1, wherein the polystyrene-reduced Z-average molecular weight is from $3.0 \times 10^5$ to $3.0 \times 10^6$.

* * * * *